United States Patent
Yamamoto et al.

(10) Patent No.: US 9,890,458 B2
(45) Date of Patent: Feb. 13, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryuji Yamamoto, Kodaira (JP); Satoshi Shimamoto, Toyama (JP); Yoshiro Hirose, Toyama (JP)

(73) Assignee: HITACHI KOKUSAI ELECTRIC, INC., Tokyo (JP)

(*) Notice: Subject to any disclaimer, the term of this patent is extended or adjusted under 35 U.S.C. 154(b) by 0 days.

(21) Appl. No.: 14/628,963

(22) Filed: Feb. 23, 2015

(65) Prior Publication Data

US 2015/0243499 A1   Aug. 27, 2015

(30) Foreign Application Priority Data

Feb. 25, 2014   (JP) .................. 2014-034332

(51) Int. Cl.
  *H01L 21/02*   (2006.01)
  *C23C 16/52*   (2006.01)
  (Continued)

(52) U.S. Cl.
  CPC .............. *C23C 16/52* (2013.01); *C23C 16/36* (2013.01); *C23C 16/38* (2013.01);
  (Continued)

(58) Field of Classification Search
  None
  See application file for complete search history.

(56) References Cited

U.S. PATENT DOCUMENTS 8,168,549 B2   5/2012  Asai
2005/0025885 A1*  2/2005  McSwiney ............ C23C 16/345
                                       427/248.1
(Continued)

FOREIGN PATENT DOCUMENTS

JP   2011-029284 A   2/2011
JP   2011-082493 A   4/2011
(Continued)

OTHER PUBLICATIONS

Japanese Office Action, JP Application No. 2014-034332, dated Oct. 6, 2015, 2 pgs. (English translation provided).
(Continued)

*Primary Examiner* — Joseph A Miller, Jr.
(74) *Attorney, Agent, or Firm* — Volpe and Koenig, P.C.

(57) ABSTRACT

A technique includes forming a film containing a first element, a second element, and carbon on a substrate by performing a cycle a predetermined number of times. The cycle includes non-simultaneously performing: forming a first solid layer containing the first element and carbon, and having a thickness of more than one atomic layer and equal to or less than several atomic layers, by supplying a precursor gas having a chemical bond of the first element and carbon to the substrate and confining the precursor gas within the process chamber, under a condition in which the precursor gas is autolyzed and at least a part of the chemical bond of the first element and carbon is maintained without being broken; and forming a second solid layer by supplying a reaction gas containing the second element to the substrate to modify the first solid layer.

19 Claims, 14 Drawing Sheets

(51) Int. Cl.
    *C23C 16/36*     (2006.01)
    *C23C 16/38*     (2006.01)
    *C23C 16/455*     (2006.01)
    *C23C 16/44*     (2006.01)
    *C23C 16/46*     (2006.01)

(52) U.S. Cl.
    CPC .... *C23C 16/4412* (2013.01); *C23C 16/45523* (2013.01); *C23C 16/46* (2013.01); *H01L 21/0228* (2013.01); *H01L 21/02126* (2013.01); *H01L 21/02167* (2013.01); *H01L 21/02271* (2013.01)

(56) References Cited

U.S. PATENT DOCUMENTS

| | | |
|---|---|---|
| 2005/0145177 A1* | 7/2005 | McSwiney ............ C23C 16/345 118/723 MA |
| 2006/0228903 A1 | 10/2006 | McSwiney et al. |
| 2010/0105192 A1 | 4/2010 | Akae et al. |
| 2010/0124618 A1 | 5/2010 | Kobayashi et al. |
| 2010/0130009 A1 | 5/2010 | Ishimaru |
| 2011/0021033 A1* | 1/2011 | Ikeuchi ................ C23C 16/402 438/758 |
| 2012/0190215 A1 | 7/2012 | Ikeuchi et al. |
| 2013/0102132 A1 | 4/2013 | Takeda |
| 2013/0252439 A1 | 9/2013 | Hirose et al. |

FOREIGN PATENT DOCUMENTS

| | | |
|---|---|---|
| JP | 2012-049506 A | 3/2012 |
| JP | 2012-049290 A | 8/2012 |
| JP | 2013-040398 A | 2/2013 |
| JP | 2013-102130 A | 5/2013 |
| KR | 10-2013-0107232 A | 10/2013 |
| KR | 10-2015-0026175 A | 3/2015 |

OTHER PUBLICATIONS

KR Notice of Preliminary Rejection, KR Patent Application No. 10-2015-0026175, dated Nov. 4, 2015, 6 pgs.

U.S. Office Action dated Nov. 28, 2016 in the U.S. Appl. No. 15/011,033.

Office Action in counterpart U.S. Appl. No. 15/011,033 dated Nov. 22, 2017.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-034332, filed on Feb. 25, 2014, the entire contents of which are incorporated herein by reference.

TECHNICAL FIELD

The present disclosure relates to a method of manufacturing a semiconductor device, which includes a process for forming a thin film on a substrate, a substrate processing apparatus, and a recording medium.

BACKGROUND

As an example of procedures of manufacturing a semiconductor device, a procedure of forming a film such as a nitride film, an oxide film or the like on a substrate is often carried out by supplying, e.g., a precursor gas containing silicon and a reaction gas such as a nitriding gas, an oxidizing gas or the like to the substrate.

If carbon (C) or the like is added to the film formed on the substrate, it is possible to increase, e.g., a resistance to hydrogen fluoride (HF). If carbon is added to the film at a high concentration by accurately controlling a carbon concentration in the film, it is possible to further increase the HF resistance of the film.

SUMMARY

The present disclosure provides some embodiments of a technique capable of forming a film having a high carbon concentration.

According to one embodiment of the present disclosure, there is provided a technique, including forming a film containing a first element, a second element, and carbon on a substrate by performing a cycle a predetermined number of times, wherein the cycle includes non-simultaneously performing: forming a first solid layer containing the first element and carbon, and having a thickness of more than one atomic layer and equal to or less than several atomic layers, by supplying a precursor gas having a chemical bond of the first element and carbon to the substrate in a process chamber and confining the precursor gas within the process chamber, under a condition in which the precursor gas is autolyzed and at least a part of the chemical bond of the first element and carbon included in the precursor gas is maintained without being broken; exhausting the precursor gas in the process chamber through an exhaust system; forming a second solid layer by supplying a reaction gas containing the second element to the substrate in the process chamber to modify the first solid layer; and exhausting the reaction gas in the process chamber through the exhaust system.

DETAILED DESCRIPTION

One Embodiment of the Present Disclosure

One embodiment of the present disclosure is described with reference to FIGS. 1 to 3.

(1) Configuration of Substrate Processing Apparatus

Figure 1:
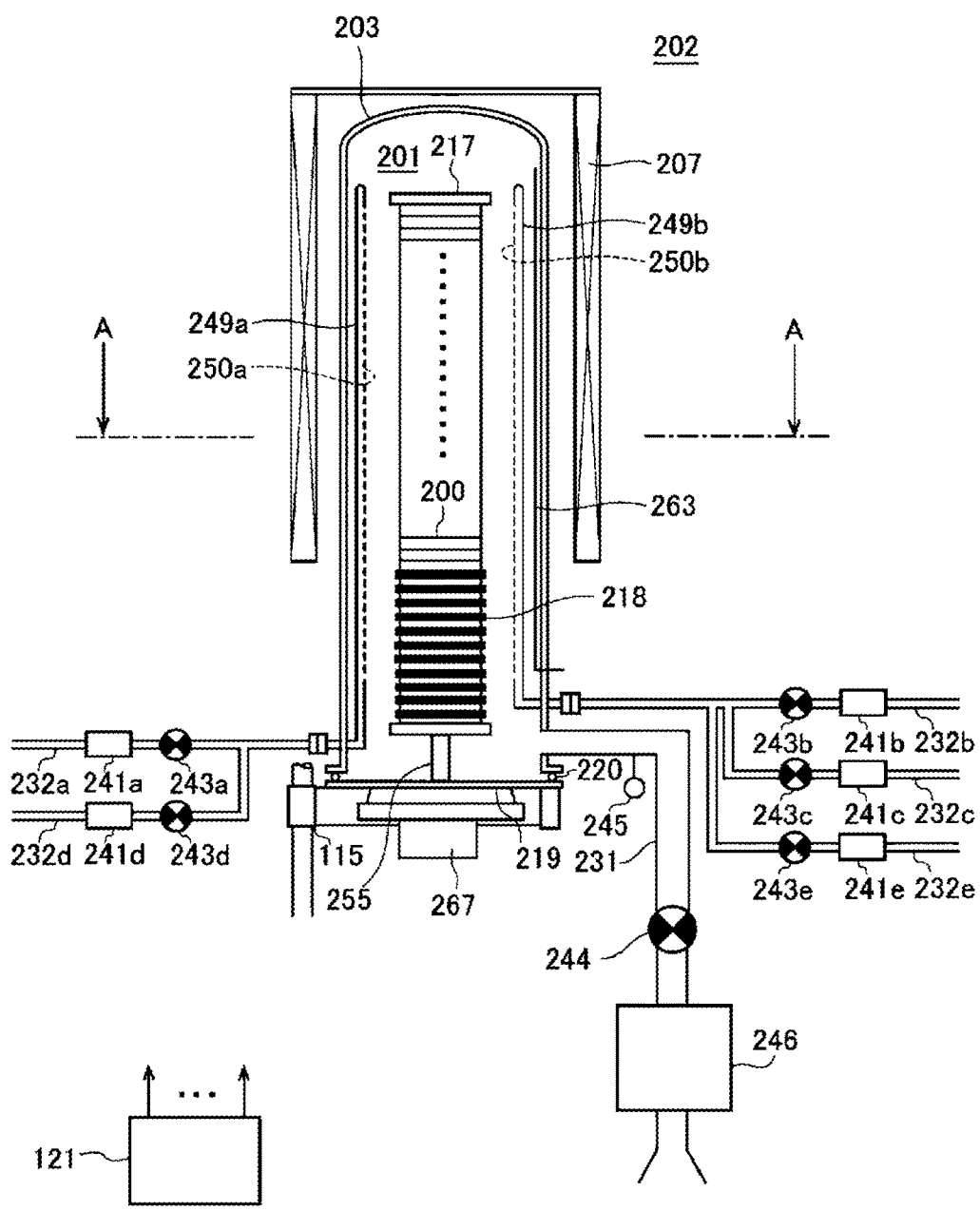
FIG. 1 is a schematic configuration view of a vertical processing furnace of a substrate processing apparatus suitably used in one embodiment of the present disclosure, in which a portion of the processing furnace is shown in a vertical cross section.
Figure 2:
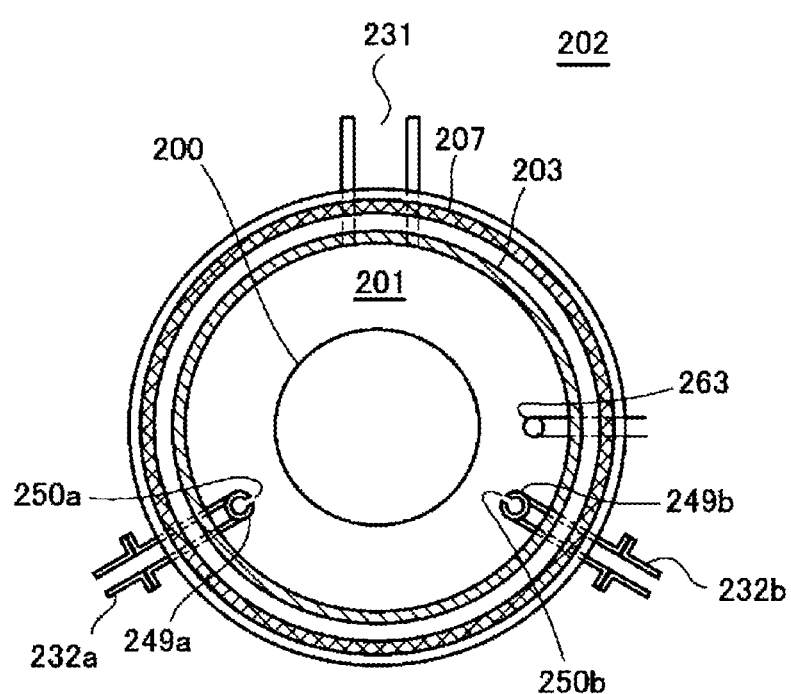
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

As shown in FIG. 1, a processing furnace 202 includes a heater 207 as a heating unit (a heating mechanism). The heater 207 has a cylindrical shape and is supported by a heater base (not shown) serving as a support plate so as to be vertically installed. As will be described later, the heater 207 functions as an activation mechanism (an excitation unit) configured to thermally activate (excite) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a and 249b are installed in the process chamber 201 to penetrate through a lower portion of the reaction tube 203. The nozzles 249a and 249b are made of, e.g., a heat resistant material such as quartz, SiC or the like. Gas supply pipes 232a and 232b are respectively connected to the nozzles 249a and 249b. A gas supply pipe 232c is connected to the gas supply pipe 232b. In this way, the two nozzles 249a and 249b and the three gas supply pipes 232a to 232c are installed in the reaction tube 203 and are configured to supply plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a to 241c, which are flow rate controllers (flow rate control units), and valves 243a to 243c, which are opening/closing valves, are sequentially installed in the gas supply pipes 232a to 232c from corresponding upstream sides. Gas supply pipes 232d and 232e, which supply an inert gas, are respectively connected to the gas supply pipes 232a and 232b at the downstream side of the valves 243a and 243b. Mass flow controllers (MFC) 241d and 241e, which are flow rate controllers (flow rate control units), and valves 243d and 243e, which are opening/closing valves, are sequentially installed in the gas supply pipes 232d and 232e from corresponding upstream sides.

The nozzles 249a and 249b are respectively connected to end portions of the gas supply pipes 232a and 232b. As shown in FIG. 2, the nozzles 249a and 249b are disposed in an annular space between the inner wall of the reaction tube 203 and the wafers 200 such that the nozzles 249a and 249b extend upward along a stacking direction of the wafers 200 from a lower portion of the inner wall of the reaction tube 203 to an upper portion thereof. Specifically, the nozzles 249a and 249b are installed along a wafer arrangement region in which the wafers 200 are arranged and in a region that horizontally surrounds the wafer arrangement region at a side of the wafer arrangement region. Each of the nozzles 249a and 249b is configured as an L-shaped nozzle. A horizontal portion of each of the nozzles 249a and 249b is installed to penetrate a lower sidewall of the reaction tube 203. A vertical portion of each of the nozzles 249a and 249b is installed to extend upward at least from one end portion of the wafer arrangement region toward the other end portion thereof. A plurality of gas supply holes 250a and 250b for supplying gas is respectively formed on side surfaces of the nozzles 249a and 249b. Each of the gas supply holes 250a and 250b is opened toward the center of the reaction tube 203 to allow the gas to be supplied toward the wafers 200. The gas supply holes 250a and 250b may be formed in a plural number so as to span from the lower portion of the reaction tube 203 to the upper portion thereof. The respective gas supply holes 250a and 250b may have the same opening area. Further, the gas supply holes 250a and 250b may be formed at a predetermined opening pitch.

As described above, in the present embodiment, gas is transferred through the nozzles 249a and 249b which are disposed in the vertically-elongated annular space, i.e., a cylindrical space, defined by the inner wall of the reaction tube 203 and end portions of the stacked wafers 200. The gas is initially injected into the reaction tube 203, near the wafers 200, through the gas supply holes 250a and 250b formed in the nozzles 249a and 249b. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the residual gas, flows toward an exhaust port, i.e., the exhaust pipe 231 which will be described later. The flow direction of the residual gas is not limited to a vertical direction but may be appropriately decided depending on a position of the exhaust port.

A precursor gas having a chemical bond of a predetermined element and carbon (C), for example, an alkylene halosilane precursor gas containing Si as the predetermined element, an alkylene group, and a halogen group and having a chemical bond of Si and C (an Si—C bond), or an alkyl halosilane precursor gas containing Si, an alkyl group, and a halogen group and having a Si—C bond, is supplied from the gas supply pipe 232a into the process chamber 201 through the MFC 241a, the valve 243a and the nozzle 249a.

In this configuration, the alkylene group is a functional group obtained by removing two hydrogen (H) atoms from chain-shaped saturated hydrocarbon (alkane), which is denoted as a chemical formula $C_nH_{2n+2}$, and is an aggregate of atoms that are denoted as a chemical formula $C_nH_{2n}$. The alkylene group includes a methylene group, an ethylene group, a propylene group, a butylene group, and so forth. The alkyl group is a functional group obtained by removing one H atom from chain-shaped saturated hydrocarbon, which is denoted as a chemical formula $C_nH_{2n+2}$, and is an aggregate of atoms that are denoted as a chemical formula $C_nH_{2n+1}$. The alkyl group includes a methyl group, an ethyl group, a propyl group, a butyl group, or the like. The halogen group includes a chloro group, a fluoro group, a bromo group, an iodine group, or the like. As such, the halogen group includes a halogen element such as chlorine (Cl), fluorine (F), bromine (Br), iodine (I) or the like.

As the alkylene halosilane precursor gas, it may be possible to use, e.g., a precursor gas containing Si, a methylene group ($-CH_2-$) as an alkylene group and a chloro group (Cl) as a halogen group, namely a chlorosilane precursor gas containing a methylene group, or a precursor gas containing Si, an ethylene group ($-C_2H_4-$) as an alkylene group, and a chloro group (Cl) as a halogen group, namely a chlorosilane precursor gas containing an ethylene group. As the chlorosilane precursor gas containing a methylene group, it may be possible to use, e.g., a methylene bis(trichlorosilane) gas, namely a bis(trichlorosilyl)methane (($SiCl_3)_2CH_2$, abbreviation: BTCSM) gas. As the chlorosilane precursor gas containing an ethylene group, it may be possible to use, e.g., an ethylene bis(trichlorosilane) gas, namely a 1,2-bis(trichlorosilyl)ethane (($SiCl_3)_2C_2H_4$, abbreviation: BTCSE) gas.

Figure 11A:
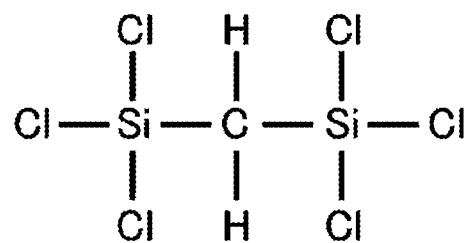
FIG. 11A is a view illustrating a chemical structural formula of BTCSM.

As shown in FIG. 11A, BTCSM contains one methylene group as an alkylene group in its chemical structural formula (in one molecule). Each of two bonds of the methylene group is bonded to Si, such that a Si—C—Si bond is formed.

Figure 11B:
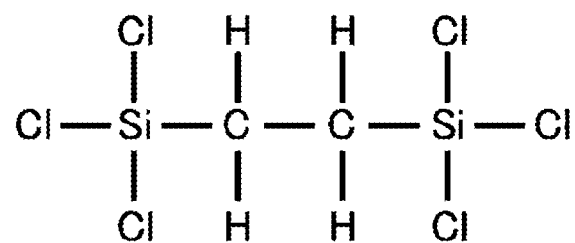
FIG. 11B is a view illustrating a chemical structural formula of BTCSE.

As shown in FIG. 11B, BTCSE contains one ethylene group as an alkylene group in one molecule. Each of two bonds of the ethylene group is bonded to Si, such that a Si—C—C—Si bond is formed.

As the alkyl halosilane precursor gas, it may be possible to use, e.g., a precursor gas containing Si, a methyl group ($-CH_3$) as an alkyl group, and a chloro group (Cl) as a halogen group, namely a chlorosilane precursor gas containing a methyl group. As the chlorosilane precursor gas containing a methyl group, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation: MCPMDS) gas, or the like. Unlike the alkylene halosilane precursor gas such as the BTCSE gas or the BTCSM gas, the alkyl halosilane precursor gas such as the TCDMDS gas, the DCTMDS gas, or the MCPMDS gas is a gas having a Si—Si bond, namely a precursor gas containing a predetermined element and a halogen element and having a chemical bond of the predetermined element.

Figure 11C:
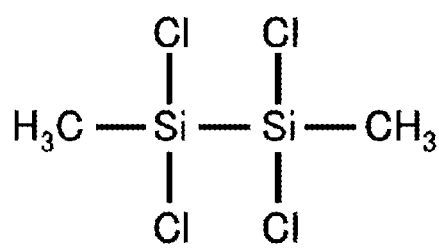
FIG. 11C is a view illustrating a chemical structural formula of TCDMDS.

As shown in FIG. 11C, TCDMDS contains two methyl groups as alkyl groups in one molecule. Each of bonds of the two methyl groups is bonded to Si, such that Si—C bonds are formed. TCDMDS is a derivative of disilane, and has a Si—Si bond. As such, TCDMDS has a Si—Si—C bond in which Si and Si are bonded to each other, and Si is bonded to C.

Figure 11D:
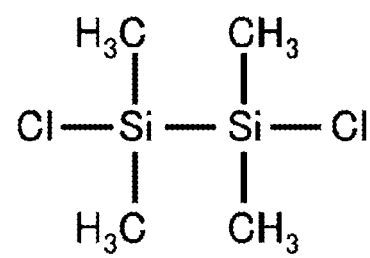
FIG. 11D is a view illustrating a chemical structural formula of DCTMDS.

As shown in FIG. 11D, DCTMDS contains four methyl groups as alkyl groups in one molecule. Each of bonds of the four methyl groups is bonded to Si, such that Si—C bonds are formed. DCTMDS is a derivative of disilane, and has a Si—Si bond. As such, DCTMDS has a Si—Si—C bond in which Si and Si are bonded to each other, and Si is bonded to C.

Figure 11E:
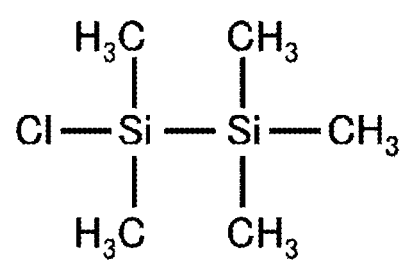
FIG. 11E is a view illustrating a chemical structural formula of MCPMDS.

As shown in FIG. 11E, MCPMDS contains five methyl groups as alkyl groups in one molecule. Each of bonds of the five methyl groups is bonded to Si, such that Si—C bonds are formed. MCPMDS is a derivative of disilane, and has a Si—Si bond. As such, MCPMDS has a Si—Si—C bond in which Si and Si are bonded to each other, and Si is bonded to C. Unlike BTCSM, BTCSE, TCDMDS, and DCTMDS, MCPMDS has an asymmetry structure in which the methyl groups and the chloro groups surrounding Si are asymmetrically arranged in one molecule (in the chemical structural formula). As described above, in the present embodiment, it may be possible to use a precursor gas having an asymmetric chemical structural formula in addition to a precursor gas having a symmetric chemical structural formula as shown in FIGS. 11A to 11D.

The alkylene halosilane precursor gas such as the BTCSM gas or the BTCSE gas, and the alkyl halosilane precursor gas such as the TCDMDS gas, the DCTMDS gas, or the MCPMDS gas may be a precursor gas which contains at least two Si atoms in one molecule, contains C and Cl, and has Si—C bonds. In a substrate processing process, which will be described later, this gas acts as a Si source and a C source. The BTCSM gas or the BTCSE gas may be referred to as an alkylene chlorosilane precursor gas. The TCDMDS gas, the DCTMDS gas, and the MCPMDS gas may be referred to as an alkyl chlorosilane precursor gas.

In the subject specification, the precursor gas refers to a precursor in a gaseous state, for example, a gas obtained by vaporizing a precursor which is in a liquid state under room temperature and atmospheric pressure, or a precursor which stays in a gaseous state under room temperature and atmospheric pressure. When the term "precursor" is used herein, it may refer to "a liquid precursor staying in a liquid state," "a precursor gas staying in a gaseous state," or both. In the case of using a liquid precursor staying in a liquid state under room temperature and atmospheric pressure, such as BTCSM or the like, the liquid precursor is vaporized by a vaporization system, such as a vaporizer or a bubbler, and is supplied as a precursor gas (a BTCSM gas or the like).

A reaction gas, e.g., a nitrogen (N)-containing gas, which differs in chemical structure (molecular structure) from the precursor gas, may be supplied from the gas supply pipe 232b into the process chamber 201 through the MFC 241b, the valve 243b, and the nozzle 249b. As the nitrogen-containing gas, it may be possible to use, e.g., a hydrogen nitride-based gas. The hydrogen nitride-based gas may be referred to as a substance consisting of only two elements N and H. In a substrate processing process, which will be described later, the nitrogen-containing gas acts as a nitriding gas, namely an N source. As the hydrogen nitride-based gas, it may be possible to use, e.g., an ammonia ($NH_3$) gas.

Alternatively, a reaction gas, e.g., an oxygen (O)-containing gas, which differs in chemical structure from the precursor gas, may be supplied from the gas supply pipe 232b into the process chamber 201 through the MFC 241b, the valve 243b, and the nozzle 249b. In a substrate processing process, which will be described later, the oxygen-containing gas acts as an oxidizing gas, namely an O source. As the oxygen-containing gas, it may be possible to use, e.g., an oxygen ($O_2$) gas.

Further alternatively, a reaction gas, e.g., an N- and C-containing gas, which differs in chemical structure from the precursor gas, may be supplied from the gas supply pipe 232b into the process chamber 201 through the MFC 241b, the valve 243b, and the nozzle 249b. As the N- and C-containing gas, it may be possible to use, e.g., an amine-based gas.

The amine-based gas is a gaseous amine gas, e.g., a gas which is obtained by vaporizing amine which is in a liquid state under room temperature and atmospheric pressure or a gas which contains an amine group such as amine or the like which is in a gaseous state under room temperature and atmospheric pressure. The amine-based gas contains amine such as ethylamine, methylamine, propylamine, isopropylamine, butylamine, isobutylamine, or the like. As used herein, the term "amine" is a generic name of compounds in which a hydrogen atom of ammonia ($NH_3$) is substituted with a hydrocarbon group such as an alkyl group or the like. Amine contains a hydrocarbon group such as an alkyl group or the like as a ligand containing C atoms, namely an organic ligand. The amine-based gas may be referred to as a Si-free gas since it contains three elements C, N, and H while not containing Si. The amine-based gas may be referred to as a Si-free and metal-free gas since it does not contain Si and metal. The amine-based gas may be a substance consisting of only three elements C, N and H. The amine-based gas acts as an N source and as a C source in a substrate processing procedure, which will be described later. The term "amine" as used herein refers to "amine in a liquid state," an "amine-based gas in a gaseous state," or both.

As the amine-based gas, it may be possible to use, e.g., a triethylamine (($(C_2H_5)_3N$), abbreviation: TEA) gas, in which the number of C-containing ligands (ethyl groups) in the chemical structural formula (in one molecule) is two or more and the number of C atoms in one molecule is larger than the number of N atoms. In the case of using amine such as TEA or the like which is in a liquid state under room temperature and atmospheric pressure, the amine in a liquid state is vaporized by a vaporization system such as a vaporizer or a bubbler, and is supplied as an N- and C-containing gas (a TEA gas).

A reaction gas, e.g., a borazine-ring-skeleton-free boron-containing gas, which differs in chemical structure from the precursor gas, may be supplied from the gas supply pipe 232b into the process chamber 201 through the MFC 241b, the valve 243b, and the nozzle 249b. As the borazine-ring-skeleton-free boron-containing gas, it may be possible to use, e.g., a borane-based gas.

The borane-based gas refers to a borane compound staying in a gaseous state, e.g., a gas obtained by vaporizing a borane compound in a liquid state under room temperature and atmospheric pressure, a borane compound in a gaseous state under room temperature and atmospheric pressure, or the like. The borane compound includes a haloborane compound containing B and a halogen element, e.g., a chloroborane compound containing B and Cl. Further, the borane compound includes borane (borohydride) such as monoborane ($BH_3$), diborane ($B_2H_6$) or the like, or a borane compound (borane derivative) in which H of borane is substituted with another element or the like. The borane-based gas acts as a B source in a substrate processing procedure, which will be described later. As the borane-based gas, it may be possible to use, e.g., a trichloroborane ($BCl_3$) gas. The $BCl_3$ gas is a boron-containing gas which does not contain a borazine compound, which will be described later, namely a non-borazine-based boron-containing gas.

In addition, a reaction gas, e.g., a borazine-ring-skeleton-containing gas, which differs in chemical structure from the precursor gas, may be supplied from the gas supply pipe 232b into the process chamber 201 through the MFC 241b, the valve 243b and the nozzle 249b. As the borazine-ring-skeleton-containing gas, it may be possible to use, e.g., a gas containing a borazine ring skeleton and an organic ligand, namely an organic borazine-based gas.

As the organic borazine-based gas, it may be possible to use, e.g., a gas containing an alkyl borazine compound which is an organic borazine compound. The organic borazine-based gas may be referred to as a borazine compound gas or a borazine-based gas.

Figure 12A:
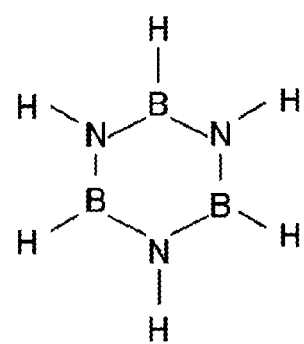
FIG. 12A is a view showing a chemical structural formula of borazine.
Figure 12B:
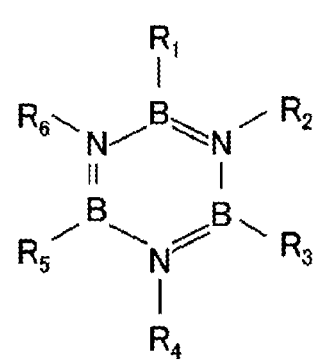
FIG. 12B is a view showing a chemical structural formula of a borazine compound.

As used herein, borazine is a heterocyclic compound composed of three elements, B, N and H. Borazine may be represented by a composition formula of $B_3H_6N_3$ and may be denoted as a chemical structural formula shown in FIG. 12A. A borazine compound is a compound which includes a borazine ring skeleton (also referred to as a "borazine skeleton") constituting a borazine ring containing three B atoms and three N atoms. The organic borazine compound is a borazine compound containing C, and may also be referred to as a borazine compound containing a C-containing ligand, namely an organic ligand. The alkyl borazine compound is a borazine compound containing an alkyl group and may be referred to as a borazine compound containing an alkyl group as an organic ligand. The alkyl borazine compound is a compound in which at least one of six H atoms contained in borazine is substituted with hydrocarbon containing one or more C atoms, and may be denoted as a chemical structural formula shown in FIG. 12B. In this case, each of $R_1$ to $R_6$ in the chemical structural formula shown in FIG. 12B is a H atom or an alkyl group containing one to four C atoms. $R_1$ to $R_6$ may be the same kind of alkyl group or may be different kinds of alkyl groups. However, not all of $R_1$ to $R_6$ should be H. The alkyl borazine compound may refer to a substance including a borazine ring skeleton, which constitutes a borazine ring, and contains B, N, H, and C. Further, the alkyl borazine compound may refer to a substance having a borazine ring skeleton and containing an alkyl ligand. In addition, each of $R_1$ to $R_6$ may be an H atom, or an alkenyl group or an alkynyl group containing one to four C atoms. $R_1$ to $R_6$ may be the same kind of an alkenyl group or an alkynyl group, or may be different kinds of alkenyl groups or alkynyl groups. However, not all of $R_1$ to $R_6$ should be H.

The borazine-based gas acts as a B source, an N source, and a C source in a substrate processing procedure, which will be described later.

Figure 12C:
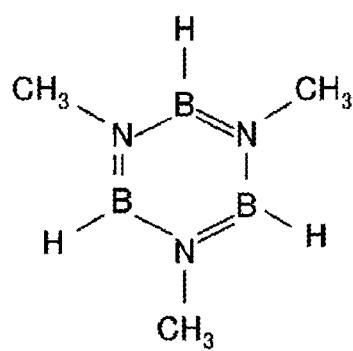
FIG. 12C is a view showing a chemical structural formula of n,n',n"-trimethylborazine.
Figure 12D:
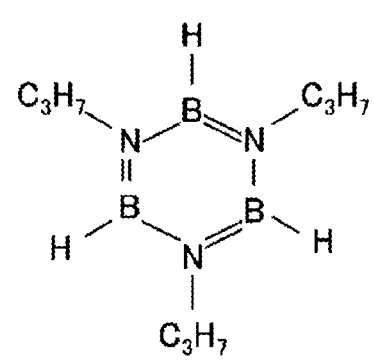
FIG. 12D is a view showing a chemical structural formula of n,n',n"-tri-n-propylborazine.

As the borazine-based gas, it may be possible to use, e.g., an n,n',n"-trimethylborazine (abbreviation: TMB) gas; an n,n',n"-triethylborazine (abbreviation: TEB) gas; an n,n',n"-tri-n-propylborazine (abbreviation: TPB) gas; an n,n',n"-triisopropylborazine (abbreviation: TIPB) gas; an n,n',n"-tri-n-butylborazine (abbreviation: TBB) gas; an n,n',n"-triisobutylborazine (abbreviation: TIBB) gas, or the like. TMB is a borazine compound in which $R_1$, $R_3$, and $R_5$ of the chemical structural formula shown in FIG. 12B are H atoms while $R_2$, $R_4$, and $R_6$ of the chemical structural formula are methyl groups. TMB may be denoted as a chemical structural formula shown in FIG. 12C. TEB is a borazine compound in which $R_1$, $R_3$, and $R_5$ of the chemical structural formula shown in FIG. 12B are H atoms while $R_2$, $R_4$, and $R_6$ of the chemical structural formula are ethyl groups. TPB is a borazine compound in which $R_1$, $R_3$, and $R_5$ of the chemical structural formula shown in FIG. 12B are H atoms while $R_2$, $R_4$, and $R_6$ of the chemical structural formula are propyl groups. TPB may be denoted as a chemical structural formula shown in FIG. 12D. TIPB is a borazine compound in which $R_1$, $R_3$, and $R_5$ of the chemical structural formula shown in FIG. 12B are H atoms while $R_2$, $R_4$, and $R_6$ of the chemical structural formula are isopropyl groups. TIBB is a borazine compound in which $R_1$, $R_3$, and $R_5$ of the chemical structural formula shown in FIG. 12B are H atoms while $R_2$, $R_4$, and $R_6$ of the chemical structural formula are isobutyl groups.

In the case of using a borazine compound such as TMB or the like, which is in a liquid state under room temperature and atmospheric pressure, the borazine compound in a liquid state is vaporized by a vaporization system such as a vaporizer or a bubbler, and is supplied as a borazine-based gas (e.g., a TMB gas).

A reaction gas, e.g., a carbon-containing gas, which differs in chemical structure from the precursor gas, may be supplied from the gas supply pipe 232c into the process chamber 201 through the MFC 241c, the valve 243c, the gas supply pipe 232b, and the nozzle 249b. As the carbon-containing gas, it may be possible to use, e.g., a hydrocarbon-based gas. The hydrocarbon-based gas may be referred to as a substance consisting of only two elements C and H. The hydrocarbon-based gas acts as a C source in a substrate processing procedure, which will be described later. As the hydrocarbon-based gas, it may be possible to use, e.g., a propylene ($C_3H_6$) gas.

An inert gas, e.g., a nitrogen ($N_2$) gas, is supplied from the gas supply pipes 232d and 232e into the process chamber 201 through the MFCs 241d and 241e, the valves 243d and 243e, the gas supply pipes 232a and 232b, and the nozzles 249a and 249b.

In the case of supplying the aforementioned precursor gas from the gas supply pipe 232a, a precursor gas supply system includes the gas supply pipe 232a, the MFC 241a, and the valve 243a. The precursor gas supply system may include the nozzle 249a. The precursor gas supply system may be referred to as a precursor supply system. In the case of supplying an alkyl halosilane precursor gas from the gas supply pipe 232a, the precursor gas supply system may be referred to as an alkyl halosilane precursor gas supply system or an alkyl halosilane precursor supply system. In the case of supplying an alkylene halosilane precursor gas from the gas supply pipe 232a, the precursor gas supply system may be referred to as an alkylene halosilane precursor gas supply system or an alkylene halosilane precursor supply system.

In the case of supplying a nitrogen-containing gas from the gas supply pipe 232b, a nitrogen-containing gas supply system includes the gas supply pipe 232b, the MFC 241b, and the valve 243b. The nitrogen-containing gas supply system may also include the nozzle 249b. The nitrogen-containing gas supply system may be referred to as a nitriding gas supply system or a nitriding agent supply system. In the case of supplying a hydrogen nitride-based gas from the gas supply pipe 232b, the nitrogen-containing gas supply system may be referred to as a hydrogen nitride-based gas supply system or a hydrogen nitride supply system.

In the case of supplying an oxygen-containing gas from the gas supply pipe 232b, an oxygen-containing gas supply system includes the gas supply pipe 232b, the MFC 241b, and the valve 243b. The oxygen-containing gas supply system may also include the nozzle 249b. The oxygen-containing gas supply system may be referred to as an oxidizing gas supply system or an oxidizing agent supply system.

In the case of supplying an N- and C-containing gas from the gas supply pipe 232b, a nitrogen- and carbon-containing gas supply system includes the gas supply pipe 232b, the MFC 241b, and the valve 243b. The nitrogen- and carbon-containing gas supply system may also include the nozzle 249b. In the case of supplying an amine-based gas from the gas supply pipe 232b, the nitrogen- and carbon-containing gas supply system may be referred to as an amine-based gas supply system or an amine supply system. The N- and C-containing gas is a nitrogen-containing gas or a carbon-containing gas. Thus, a nitrogen-containing gas supply system or a carbon-containing gas supply system, which will be described later, may include the nitrogen- and carbon-containing gas supply system.

In the case of supplying a boron-containing gas from the gas supply pipe 232b, a boron-containing gas supply system includes the gas supply pipe 232b, the MFC 241b, and the valve 243b. The boron-containing gas supply system may also include the nozzle 249b. In the case of supplying a borane-based gas from the gas supply pipe 232b, the boron-containing gas supply system may be referred to as a borane-based gas supply system or a borane compound supply system. In the case of supplying a borazine-based gas from the gas supply pipe 232b, the boron-containing gas supply system may be referred to as a borazine-based gas supply system, an organic borazine-based gas supply system, or a borazine compound supply system. The borazine-based gas is an N- and C-containing gas, which is also a nitrogen-containing gas or a carbon-containing gas. Thus, a nitrogen- and carbon-containing gas supply system, a nitrogen-containing gas supply system, or a carbon-containing gas supply system may include the borazine-based gas supply system.

In the case of supplying a carbon-containing gas from the gas supply pipe 232c, a carbon-containing gas supply system includes the gas supply pipe 232c, the MFC 241c, and the valve 243c. The carbon-containing gas supply system may also include the nozzle 249b disposed at a downstream side of a connection portion of the gas supply pipe 232b and the gas supply pipe 232c. In the case of supplying a hydrocarbon-based gas from the gas supply pipe 232c, the carbon-containing gas supply system may be referred to as a hydrocarbon-based gas supply system or a hydrocarbon supply system.

One or all of the nitrogen-containing gas supply system, the oxygen-containing gas supply system, the nitrogen- and carbon-containing gas supply system, the boron-containing gas supply system, and the carbon-containing gas supply system may be referred to as a reaction gas supply system.

An inert gas supply system includes the gas supply pipes 232d and 232e, the MFCs 241d and 241e, and the valves 243d and 243e. The inert gas supply system may be referred to as a purge gas supply system or a carrier gas supply system.

An exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting unit) for detecting an internal pressure of the process chamber 201, and an Auto Pressure Controller (APC) valve 244, which is a pressure regulator (pressure regulating unit). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system includes the exhaust pipe 231, the APC valve 244, and the pressure sensor 245. The exhaust system may also include the vacuum pump 246. In addition, the APC valve 244 constitutes a part of an exhaust flow path of the exhaust system. The APC valve 244 serves not only as a pressure regulator but also as an exhaust flow path opening/closing unit, i.e., an exhaust valve, which can close or seal the exhaust flow path of the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later is installed at a side of the seal cap 219 opposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With the above configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a desired temperature distribution. Similar to the nozzles 249a and 249b, the temperature sensor 263 is formed in an L-shape. The temperature sensor 263 is installed along the inner wall of the reaction tube 203.

Figure 3:
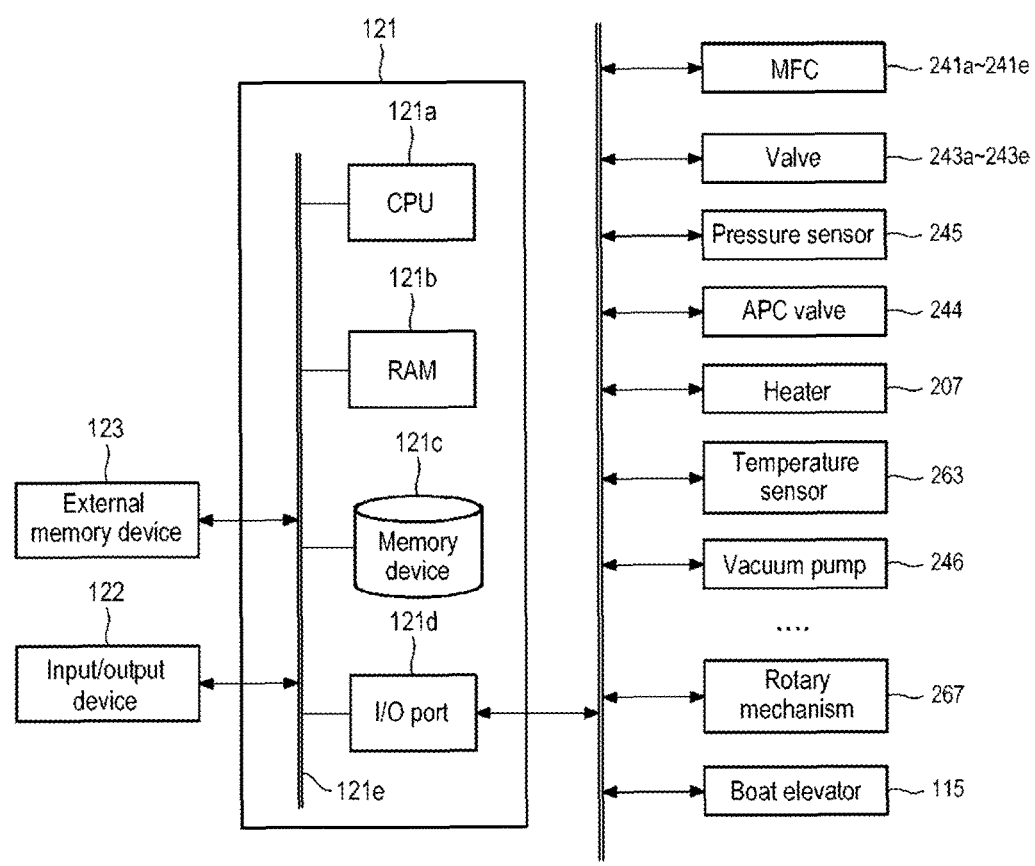
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control unit (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed, e.g., of a touch panel or the like, is connected to the controller 121.

The memory device 121c is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. Also, the process recipe functions as a program for the controller 121 to execute each sequence in the substrate processing procedure, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a also reads the process recipe from the memory device 121c according to an input of an operation command from the input/output device 122. In addition, the CPU 121a is configured to control the flow rate adjusting operation of various kinds of gases by the MFCs 241a to 241e, an opening/closing operation of the valves 243a to 243e, the opening/closing operation of the APC valve 244, the pressure regulating operation by the APC valve 244 based on the pressure sensor 245, the start/stop operation of the vacuum pump 246, the temperature adjusting operation by the heater 207 based on the temperature sensor 263, the rotation and rotation speed adjusting operation of the boat 217 by the rotary mechanism 267, the elevation operation of the boat 217 by the boat elevator 115, and the like, according to contents of the read process recipe.

Moreover, the controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for providing the program to the computer is not limited to the case in which the program is provided through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as a "recording medium." In addition, when the term "recording medium" is used herein, it may include a case of including only the memory device 121c, a case of including only the external memory device 123, or a case of including both the memory device 121c and the external memory device 123.

(2) Substrate Processing Process

An example of a procedure for forming a thin film on a substrate, which is one of the procedures for manufacturing a semiconductor device by using the above described substrate processing apparatus, is described below with reference to FIG. 4. In the following descriptions, the operations of the respective units or parts constituting the substrate processing apparatus are controlled by the controller 121.

Figure 4:
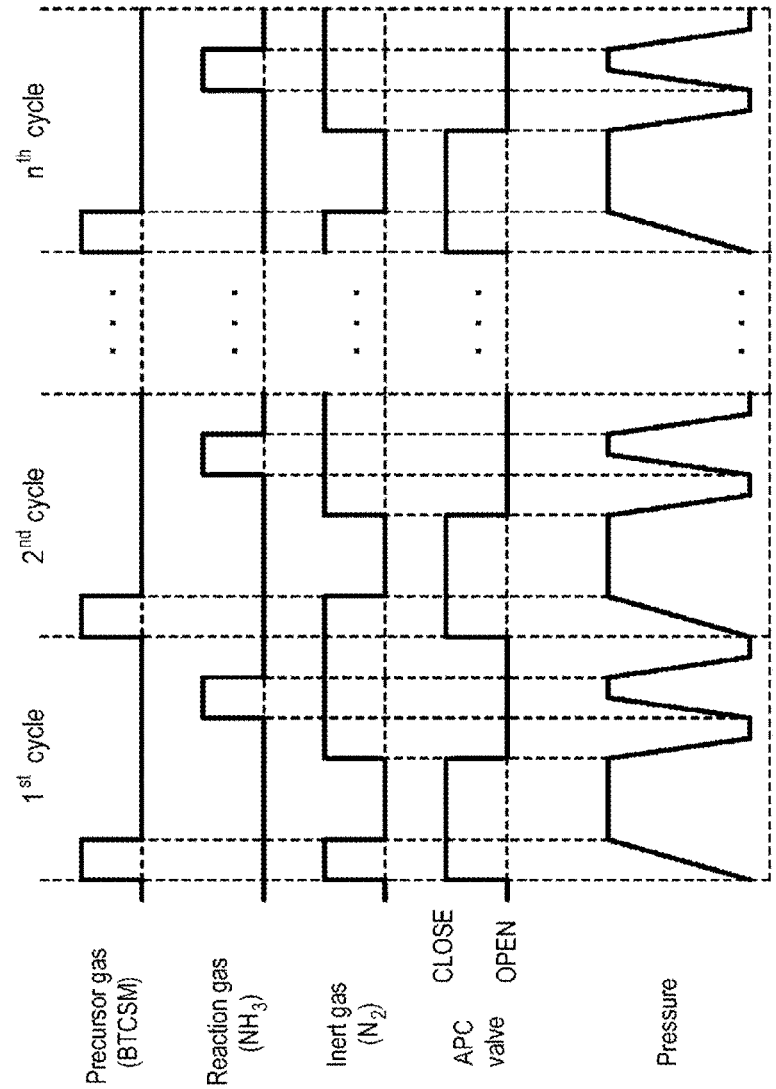
FIG. 4 is a view illustrating gas supply timings and a change of an internal pressure of a process chamber in a film forming sequence according to one embodiment of the present disclosure.

In a film forming sequence shown in FIG. 4, a silicon carbonitride film (SiCN film) as a film containing Si, N and C is formed on a wafer 200 as a substrate by performing a predetermined number of times (n times) a cycle that includes non-simultaneously (without synchronization) performing a step of forming a first solid layer containing Si and C and having a thickness of more than one atomic layer and equal to or less than several atomic layers, by supplying a BTCSM gas as a precursor gas to the wafer 200 in the process chamber 201 and confining the BTCSM gas within the process chamber 201, under a condition in which the BTCSM gas having a Si—C bond is autolyzed (pyrolyzed) and at least a part of the Si—C bond included in the BTCSM gas is maintained without being broken; a step of exhausting the BTCSM gas in the process chamber 201 through the exhaust system; a step of forming a second solid layer by supplying an $NH_3$ gas as a reaction gas containing N to the wafer 200 in the process chamber 201 to modify the first solid layer; and a step of exhausting the $NH_3$ gas in the process chamber 201 through the exhaust system.

In the film forming sequence illustrated in FIG. 4, the exhaust system may be closed when the BTCSM gas is supplied into the process chamber 201. For example, when confining the BTCSM gas within the process chamber 201, the APC valve 244 is fully closed so as to completely (reliably) close the exhaust flow path of the exhaust system with no gap, namely so as to seal the exhaust system. In the film forming sequence illustrated in FIG. 4, the exhaust system may be sealed even after the supply of the BTCSM gas into the process chamber 201 is stopped, thereby maintaining the confined state of the BTCSM gas for a predetermined time period. The "pressure" shown in FIG. 4 is an internal pressure (total pressure) of the process chamber 201 indicated with an arbitrary unit (a.u.).

As used herein, the phrase "performing a cycle a predetermined number of times" means that the cycle is performed once or a plurality of times. In other words, the phrase may also mean that the cycle is performed one or more times. FIG. 4 illustrates an example in which the cycle is repeated n times.

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of the wafer, which is a laminated body."

As such, as used herein, the phrase "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the phrase "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

(Wafer Charging and Boat Loading)

When the plurality of wafers 200 is charged on the boat 217 (wafer charging), as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

An internal pressure of the process chamber 201, namely the space in which the wafers 200 exist, is vacuum-exhausted (pressure-reducing exhaust) by the vacuum pump 246 to reach a desired pressure (desired vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 reaches a desired temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(SiCN Film Forming Process)

Next, the following two steps, i.e., Steps 1 and 2, are sequentially performed.

[Step 1]

(BTCSM Gas Supply)

While keeping the exhaust system sealed, the BTCSM gas is supplied to the wafer 200 in the process chamber 201 and is confined within the process chamber 201.

When sealing the exhaust system, the APC valve 244 is fully closed. When supplying the BTCSM gas to the wafer 200 in the process chamber 201, the valve 243a is opened to flow the BTCSM gas through the gas supply pipe 232a. The BTCSM gas is flow rate-adjusted by the MFC 241a. The flow rate-adjusted BTCSM gas is supplied into the process chamber 201 through the gas supply holes 250a. At the same time, the valve 243d is opened to flow $N_2$ gas through the gas supply pipe 232d. The $N_2$ gas is flow rate-adjusted by the MFC 241d and is supplied into the process chamber 201 together with the BTCSM gas. In order to prevent infiltration of the BTCSM gas into the nozzle 249b, the valve 243e is opened to flow $N_2$ gas through the gas supply pipe 232e. The $N_2$ gas is supplied into the process chamber 201 via the gas supply pipe 232b and the nozzle 249b.

In the above operation, the supply flow rate of the BTCSM gas controlled by the MFC 241a is set to fall within a range of, e.g., 1 to 2,000 sccm, specifically, 10 to 1,000 sccm. The supply flow rate of the $N_2$ gas controlled by the MFCs 241d and 241e is set to fall within a range of, e.g., 100 to 10,000 sccm. As the BTCSM gas is supplied into the process chamber 201 while keeping the exhaust system sealed, the internal pressure of the process chamber 201 begins to increase as shown in FIG. 4. Thereafter, if the internal pressure of the process chamber 201 reaches a predetermined pressure within a range of, e.g., 1 to 4,000 Pa, specifically, 67 to 2,666 Pa, or more specifically, 133 to 1,333 Pa, the valves 243a, 243d and 243e are closed to stop the supply of the BTCSM gas and the $N_2$ gas into the process chamber 201. Thereafter, the exhaust system is kept in a sealed state such that the internal pressure of the process chamber 201 is maintained constant for a predetermined period of time. A time period for supplying the BTCSM gas into the process chamber 201, is set to fall within a range of, e.g., 1 to 60 seconds, specifically, 1 to 30 seconds. A time period for maintaining the exhaust system in the sealed state after the supply of the BTCSM gas is stopped, is set to fall within a range of, e.g., 1 to 60 seconds, specifically, 1 to 30 seconds. A gas supply time (irradiation time) to the wafer 200, namely the exposure time of the wafer 200 to the BTCSM gas, is equal to the sum of the time period for supplying the BTCSM gas into the process chamber 201 and the time period for maintaining the exhaust system in the sealed state after the supply of the BTCSM gas is stopped. The temperature of the heater 207 is set such that the temperature of the wafer 200 falls within a range of, e.g., 400 to 800 degrees C., specifically, 500 to 700 degrees C., or more specifically, 600 to 700 degrees C.

If the temperature of the wafer 200 is less than 400 degrees C., BTCSM is hardly chemisorbed onto the wafer 200. In this case, a practical deposition rate cannot be obtained. The above-described problem may be solved by increasing the temperature of the wafer 200 to 400 degrees C. or higher. By setting the temperature of the wafer 200 at 500 degrees C. or higher, the BTCSM can be sufficiently adsorbed onto the wafer 200, to thereby obtain a high deposition rate. Alternatively, by setting the temperature of the wafer 200 at 600 degrees C. or higher, specifically, 650 degrees C. or higher, the BTCSM gas can be further adsorbed onto the wafer 200. This makes it possible to obtain a higher deposition rate.

If the temperature of the wafer 200 exceeds 800 degrees C., a CVD reaction may be made stronger (an excessive gas phase reaction may be generated). In this case, the film thickness uniformity may be hard to control and often deteriorate. By setting the temperature of the wafer 200 at 800 degrees C. or lower, a suitable gas phase reaction may be generated. In this way, the deterioration of the film thickness uniformity can be prevented and, thus, the film thickness uniformity can be controlled. In particular, if the temperature of the wafer 200 is set at 700 degrees C. or lower, the surface reaction becomes more dominant than the gas phase reaction. Thus, it becomes possible to secure the film thickness uniformity and control the film thickness uniformity.

Accordingly, the temperature of the wafer 200 may be set to fall within a range of 400 to 800 degrees C., specifically, 500 to 700 degrees C., or more specifically, 600 to 700 degrees C. The BTCSM gas is low in degradability (low in reactivity) and a pyrolysis temperature of the BTCSM gas is high. Therefore, even if a film is formed in a relatively-high temperature zone, e.g., of 650 to 800 degrees C., it is possible to generate a suitable gas phase reaction. Thus, it becomes possible to prevent an excessive gas phase reaction from being generated, thereby preventing particles from being generated from the excessive gas phase reaction.

By confining the BTCSM gas within the process chamber 201 under the aforementioned conditions, it is possible to sufficiently secure the time period in which the BTCSM gas stays within the process chamber 201, namely the heating time required in pyrolysis of the BTCSM gas. Further, by confining the BTCSM gas, an internal pressure of the process chamber 201 is allowed to rapidly reach a specified pressure higher than a pressure when the exhaust system is opened, and to be maintained at the specified pressure. This makes it possible to increase the reaction efficiency and to appropriately promote the pyrolysis of the BTCSM gas. Thus, at least a part of the BTCSM gas confined within the process chamber 201 is pyrolyzed (autolyzed) and the gas phase reaction, i.e., the chemical vapor deposition (CVD) reaction, of the BTCSM gas is properly generated within the process chamber 201. As a result, a first solid layer, e.g., a Si-containing layer which contains C and Cl and has a thickness of more than one atomic layer and equal to or less than several atomic layers, is formed (deposited) on the wafer 200 (on a base film of the surface of the wafer 200).

The first solid layer is not a non-solid layer such as an adsorption layer of the BTCSM gas or the like, but a deposition layer, namely a solid layer, which is formed as a result of the pyrolysis of the BTCSM gas and the deposition of Si, C and Cl contained in the BTCSM gas. The first solid layer may be referred to as a Si layer containing C and Cl, or a SiC layer containing Cl. The first solid layer may include a chemisorption layer of BTCSM. The first solid layer may not include a physical adsorption layer of the BTCSM gas, or may scarcely include a physical adsorption layer of the BTCSM gas. As compared with, e.g., a physical adsorption layer of the BTCSM gas, namely a non-solid layer, which is formed under a condition in which the BTCSM gas is physically adsorbed onto the wafer 200, the first solid layer is stronger and more stable in a bond between atoms constituting the layer. Moreover, as compared with a layer composed of only a chemisorption layer of the BTCSM gas, the first solid layer is stronger and more stable in a bond between atoms constituting the layer. It may be more advantageous to form a deposition layer, i.e., a solid layer, in which Si, C and Cl are deposited, on the wafer 200 than to form an adsorption layer of the BTCSM gas, i.e., a non-solid layer, on the wafer 200. By doing so, it is possible to increase the thickness of a layer formed at Step 1, namely the thickness of a layer formed per cycle, which in turn increases a cycle rate, i.e., a deposition rate.

Si constituting the first solid layer may include Si whose bond to C or Cl is not completely broken as well as Si whose bond to C or Cl are completely broken.

Under the aforementioned conditions, in the course of formation of the first solid layer, at least a part of the Si—C bond included in the BTCSM gas is maintained without being broken and is directly introduced into the first solid layer. Thus, the first solid layer may have a higher ratio of the Si—C bond among the layer than a layer formed by using, e.g., plasma, under a condition in which the Si—C bond in the BTCSM gas is easily broken. The first solid layer may become a stable layer including a large number of strong Si—C bonds. Since the ratio of the Si—C bond in the first solid layer is high, C is hardly desorbed from the first solid layer. That is, a probability of desorption of C form the first solid layer is low.

The BTCSM gas includes a plurality of Si—C bonds (e.g., two Si—C bonds) in one molecule (in the chemical structural formula thereof). Therefore, the Si—C bonds are easily introduced into the first solid layer. For example, even if one Si—C bond of a Si—C—Si bond of the BTCSM gas is broken under a condition in which the pyrolysis of the BTCSM gas is generated, another Si—C bond is maintained without being broken and is introduced into the first solid layer. With such configuration, the first solid layer may have a higher ratio of the Si—C bond among the layer than a layer formed by using a precursor gas having only one Si—C bond. Thus, the first solid layer may be a stable layer in which a larger number of strong Si—C bonds is included and a probability of desorption of C from the first solid layer is low.

By performing the formation of the first solid layer under the condition in which the gas phase reaction, i.e., the CVD reaction, of the BTCSM gas is generated, a thickness of the first solid layer can be made larger than a thickness of a chemisorption layer (or a saturated adsorption layer) of BTCSM formed under a condition in which the chemisorption of BTCSM onto the wafer 200 is saturated. That is to say, the thickness of the first solid layer can be made larger than the thickness of a chemisorption layer of BTCSM formed by self-limiting the chemisorption of BTCSM onto the wafer 200. It may be advantageous to set the thickness of the first solid layer formed on the wafer 200 at e.g., more than one atomic layer. By setting the thickness of the first layer at a thickness of more than one atomic layer, the absolute number of Si—C bonds included in the layer can be made larger than that of the saturated adsorption layer of BTCSM. With such configuration, the first solid layer may include a larger number of strong Si—C bonds. That is, the bonds between atoms constituting the layer may be strong and stable. Also, it is possible to reduce the probability of desorption of C from the layer.

If the thickness of the first solid layer formed on the wafer 200 exceeds several atomic layers, the modifying reaction at Step 2, which will be described below, may not affect the entire first solid layer.

Accordingly, it may be advantageous that the thickness of the first solid layer is set to become more than one atomic layer and several atomic layers or less. If the thickness of the first solid layer is set to become, e.g., two to three atomic layers or less, specifically, two atomic layers or less, it is possible to relatively increase the modifying reaction at Step 2, which will be described later, and to shorten the time required in the modifying reaction at Step 2. It is also possible to shorten the time required in the formation of the first solid layer at Step 1. As a result, it is possible to shorten the processing time per cycle, thereby shortening the overall processing time. That is to say, it becomes possible to increase the deposition rate. In addition, if the thickness of the first solid layer is set to be, e.g., two to three atomic layers or less, specifically, two atomic layers or less, the controllability of the film thickness uniformity may be enhanced.

(Residual Gas Removal)

After the first solid layer is formed, the valve 243a is closed to stop the supply of the BTCSM gas. Further, the APC valve 244 is opened and the interior of the process chamber 201 is evacuated by the vacuum pump 246. The BTCSM gas, which has not reacted or remains after forming the first solid layer, remaining in the process chamber 201, is removed from the interior of the process chamber 201. At this time, the valves 243d and 243e are opened to supply the $N_2$ gas into the process chamber 201. The $N_2$ gas acts as a purge gas. This makes it possible to effectively remove the BTCSM gas, which has not reacted or remains after forming the first solid layer, remaining in the process chamber 201 from the interior of the process chamber 201.

In this operation, the gas remaining within the process chamber 201 may not be completely removed and the interior of the process chamber 201 may not be completely purged. If the amount of the gas remaining within the process chamber 201 is small, an adverse effect may not be generated at Step 2, which will be subsequently performed. The flow rate of the $N_2$ gas supplied into the process chamber 201 need not be made large. For example, an amount of the $N_2$ gas to be supplied into the process chamber 201 may be substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to prevent the consumption of the $N_2$ gas to a necessary minimum level.

As the precursor gas, it is possible to use e.g., a BTCSE gas, a TCDMDS gas, a DCTMDS gas or an MCPMDS gas in addition to the BTCSM gas. As the inert gas, it is possible to use e.g., a rare gas such as an Ar gas, a He gas, a Ne gas, a Xe gas or the like in addition to the $N_2$ gas.

[Step 2]

($NH_3$ Gas Supply)

After step 1 is completed, an $NH_3$ gas is supplied to the wafer 200 in the process chamber 201 while the exhaust system is opened.

At this step, the $NH_3$ gas flows through the gas supply pipe 232b. That is to say, while keeping the APC valve 244 opened at a predetermined opening degree, the valve 243b is opened to flow the $NH_3$ gas through the gas supply pipe 232b. The opening/closing control of the valves 243d and 243e is performed in the same or similar manner as the opening/closing control of the valves 243d and 243e performed at Step 1.

At this operation, a supply flow rate of the $NH_3$ gas is controlled by the MFC 241b and set to fall within a range of, e.g., 100 to 10,000 sccm. An internal pressure of the process chamber 201 is set to fall within a range of, e.g., 1 to 4,000 Pa, specifically, 1 to 3,000 Pa. A partial pressure of the $NH_3$ gas within the process chamber 201 is set to fall within a range of, e.g., 0.01 to 3,960 Pa. By setting the internal pressure of the process chamber 201 to such a relatively-high pressure range, it becomes possible to thermally activate the $NH_3$ gas under a non-plasma condition. If the $NH_3$ gas is thermally activated and supplied, a reaction may occur softly, and thus nitriding of the first solid layer, which will be described later, may be performed softly. For example, when performing the nitriding, it is possible to prevent the Si—C bond included in the first solid layer from breaking and to prevent desorption of C from the first solid layer. The time period in which the thermally-activated $NH_3$ gas is supplied to the wafer 200, i.e., the gas supply time (irradiation time), is set to fall within a range of, e.g., 1 to 120 seconds, specifically, 1 to 60 seconds. Other processing conditions may be the same as, e.g., the processing conditions of Step 1 described above.

By supplying the thermally-activated $NH_3$ gas to the wafer 200 under the aforementioned conditions, at least a portion of the first solid layer is nitrided (modified). As a result of the modification of the first solid layer, a second layer containing Si, C and N, i.e., a SiCN layer, is formed on the wafer 200.

When forming the second solid layer, at least a part of the Si—C bond in the first solid layer is maintained without being broken and is directly introduced into (or remains within) the second solid layer. With such configuration, the second solid layer may have a higher ratio of the Si—C bonds among the layer than a layer formed under a condition in which the Si—C bond in the first solid layer is easily broken, e.g., a condition in which the $NH_3$ gas is by thermally activated with plasma. Thus, the second solid layer may be a stable layer in which a larger number of strong Si—C bonds are included and the bonds between atoms constituting the layer are strong. Since the ratio of the strong Si—C bonds in the second solid layer is high and the bonds between atoms in the second solid layer are strong, a probability of desorption of C from the second solid layer may be low. In addition, the first solid layer itself includes a large amount of strong Si—C bonds and has strong and stable bonds between the atoms constituting the layer. That is, the first solid layer has a low probability of desorption of C. Therefore, even if the $NH_3$ gas activated with plasma is used, it is possible to prevent desorption of C from the layer. That is to say, it is possible in the present embodiment to use the $NH_3$ gas activated with plasma.

When forming the second solid layer, impurities such as Cl and the like contained in the first solid layer may become a gaseous substance containing at least Cl in the course of the modifying reaction caused by the $NH_3$ gas. The gaseous substance is discharged from the interior of the process chamber 201. That is to say, the impurities such as Cl and the like contained in the first solid layer are extracted or desorbed from the first solid layer, and are eventually separated from the first solid layer. As such, the second solid layer becomes a layer having a smaller amount of impurities such as Cl and the like than the first solid layer.

(Residual Gas Removal)

After the second solid layer is formed, the valve 243b is closed to stop the supply of the $NH_3$ gas. Then, with the similar processing procedures to those of Step 1, it is possible to remove the $NH_3$ gas, which has not reacted or remains after forming the second solid layer, or a reaction byproduct, remaining in the process chamber 201 from the interior of the process chamber 201. Similar to Step 1, the gas remaining in the process chamber 201 may not be completely removed.

As the nitrogen-containing gas (nitriding gas) used as the reaction gas, it is possible to use e.g., a hydrogen nitride-based gas such as a diazene ($N_2H_2$) gas, a hydrazine ($N_2H_4$) gas, an $N_3H_8$ gas or the like in addition to the $NH_3$ gas, or a gas containing the above compounds. As the inert gas, it is possible to use e.g., a rare gas such as an Ar gas, a He gas, a Ne gas, a Xe gas, or the like in addition to the $N_2$ gas.

(Performing a Cycle a Predetermined Number of Times)

A cycle which non-simultaneously performs steps 1 and 2 as described above one or more times (a predetermined number of times) to form a SiCN film having a predetermined composition and a predetermined thickness on the wafer 200. The above cycle may be repeated multiple times. As such, a thickness of the SiCN layer formed per cycle is set to be smaller than a desired film thickness and the above cycle may be repeated multiple times until the desired film thickness is obtained.

In the configuration in which the cycle is performed multiple times, the phrase "a predetermined gas is supplied to the wafer 200" at each step in at least a second cycle or subsequent cycles may mean that "a predetermined gas is supplied to a layer formed on the wafer 200, namely on the uppermost surface of the wafer 200 as a laminated body." The phrase "a predetermined layer is formed on the wafer 200" may mean that "a predetermined layer is formed on a layer formed on the wafer 200, namely on the uppermost surface of the wafer 200 as a laminated body." The above definitions are the same as those described above. These definitions also apply to each of modifications and other embodiments, which will be described later.

(Purge and Return to Atmospheric Pressure)

The valves 243d and 243e are opened. The $N_2$ gas is supplied into the process chamber 201 from each of the gas supply pipes 232d and 232e, and is exhausted through the exhaust pipe 231. The $N_2$ gas serves as a purge gas. Thus, the interior of the process chamber 201 is purged, and residual gas or the reaction byproduct remaining within the process chamber 201 is removed from the interior of the process chamber 201 (purge). Thereafter, the internal atmosphere of the process chamber 201 is substituted with an inert gas (inert gas substitution), and the internal pressure of the process chamber 201 is returned to atmospheric pressure (return to atmospheric pressure).

(Boat Unloading and Wafer Discharge)

The seal cap 219 is moved down by the boat elevator 115 to open the lower end portion of the reaction tube 203. The processed wafers 200 supported by the boat 217 are unloaded from the lower end portion of the reaction tube 203 outside of the reaction tube 203 (boat unloading). Thereafter, the processed wafers 200 are discharged from the boat 217 (wafer discharge).

(3) Effects According to the Present Embodiment

According to the present embodiment, one or more effects may be achieved, as follows.

(a) By forming the first solid layer under the condition in which the BTCSM gas is pyrolyzed, the first solid layer may become a deposition layer, i.e., a solid layer, composed of deposited Si, C and Cl, instead of a non-solid layer such as an adsorption layer of the BTCSM gas or the like. Thus, the first solid layer becomes a layer in which the bonds between atoms constituting the layer are stronger and more stable.

By forming the first solid layer under the condition in which at least a part of the Si—C bonds included in the BTCSM gas is maintained without being broken, the first solid layer may become a layer having a large ratio of Si—C bonds in the layer. Thus, the first solid layer can be a stable layer which contains a large amount of strong Si—C bonds and has a low probability of desorption of C from the layer.

By using the precursor gas having a plurality of Si—C bonds in one molecule such as the BTCSM gas or the like, the first solid layer may become a layer having a larger ratio of Si—C bonds in the layer. Thus, the first solid layer may become a more stable layer in that the first solid layer contains a larger amount of strong Si—C bonds and has a lower probability of desorption of C from the layer.

By setting the thickness of the first solid layer at a thickness of more than one atomic layer, the absolute amount of Si—C bonds contained in the first solid layer may be made larger than that of the saturated adsorption layer of BTCSM. Thus, the first solid layer may become a layer which contains a large amount of strong Si—C bonds and which has stronger and more stable bonds between atoms making up the layer and a layer which has a lower probability of desorption of C.

When forming the second solid layer, the activation of the $NH_3$ gas is performed under a non-plasma atmosphere, namely under a non-plasma condition, through the use of heat. This makes it possible to prevent the Si—C bonds contained in the first solid layer from breaking That is to say, the formation of the second solid layer is performed under the condition in which at least a part of the Si—C bonds contained in the first solid layer is maintained without being broken. This makes it possible to prevent the Si—C bonds contained in the first solid layer from being reduced and desorption of C from the first solid layer. Thus, it becomes possible to prevent the Si—C bonds contained in the second solid layer from being reduced and reduction of the C concentration in the second solid layer. Thus, the second solid layer can be made a layer which contains a large amount of strong Si—C bonds and which has strong and stable bonds between atoms making up the layer and a layer which has a low probability of desorption of C.

As a result, the finally-formed SiCN film can be made a stable film which contains a large amount of strong Si—C bonds and which has strong bonds between atoms making up the layer. Moreover, the finally-formed SiCN film can be made a film which has a low probability of desorption of C and which has a high C concentration. Consequently, the SiCN film can be made a film having a high HF resistance.

As described above, the first solid layer itself is a layer which contains a large amount of strong Si—C bonds and which has strong and stable bonds between atoms making up the layer, namely a layer which has a low probability of desorption of C. Therefore, even if the NH$_3$ gas activated with plasma is used when forming the second solid layer, it is possible to prevent desorption of C from the layer. That is to say, even if the NH$_3$ gas activated with plasma is used, the finally-formed SiCN film can be made a film which has a high C concentration, namely a film which has a high HF resistance. However, it may be advantageous to use the NH$_3$ gas activated with heat than to use the NH$_3$ gas activated with plasma. By doing so, it is possible to obtain a SiCN film which has a higher C concentration, namely a SiCN film which has a higher HF resistance.

(b) By sealing the exhaust system and confining the BTCSM gas within the process chamber 201 when forming the first solid layer, it is possible to sufficiently secure the heating time required in pyrolysis of the BTCSM gas. By virtue of this confinement of the BTCSM gas, the internal pressure of the process chamber 201 can be caused to rapidly reach a pressure higher than the pressure available when the exhaust system is opened, and can be maintained at that pressure. This makes it possible to increase the reaction efficiency. Thus, it becomes possible to appropriately promote the pyrolysis of the BTCSM gas supplied into the process chamber 201 and to promote the formation of the first solid layer. As a result, it becomes possible to increase the formation rate of the first solid layer, namely the deposition rate of the finally-formed SiCN film. According to the present embodiment, even if the SiCN film is formed in a relatively-low temperature zone of, e.g., 400 to 500 degrees C., it becomes easy to generate the pyrolysis of the BTCSM gas. This makes it possible to perform the formation of the SiCN film at a practical deposition rate. Moreover, it is possible to reduce the amount of the BTCSM gas discharged from the interior of the process chamber 201 without contributing to the formation of the first solid layer. This makes it possible to increase the utilization efficiency of the BTCSM gas and to reduce the film formation cost.

(c) By performing the process of forming the first solid layer under the condition in which the CVD reaction is generated, namely under the condition in which the gas phase reaction of the BTCSM gas is generated, the thickness of the first solid layer can be made larger than the thickness of a saturated adsorption layer of BTCSM. As a result, it is possible to improve the formation rate of the first solid layer, namely the deposition rate of the finally-formed SiCN film, thereby increasing the productivity of a film forming process.

(d) By supplying the reaction gas such as the activated NH$_3$ gas or the like at step 2, it is possible to efficiently extract or desorb the impurities such as Cl and the like from the first solid layer. It is also possible to cause the second solid layer to become a layer which is smaller in the amount of impurities than the first solid layer. As a result, even if a film is formed in a relatively-low temperature zone of, e.g., 400 to 500 degrees C., it becomes possible to reduce the concentration of impurities in the SiCN film. Consequently, the SiCN film can be made a film having a higher HF resistance.

(e) By performing the aforementioned cycle a predetermined number of times under a non-plasma condition, it becomes possible to avoid plasma damage to the wafer 200 or the SiCN film formed on the wafer 200. For example, it is possible to avoid a situation that a gate insulation film or the like formed on the wafer 200 is destroyed due to physical damage such as collision of charged particles or the like, or a situation that a device structure formed on the wafer 200 is charged with electric charges and is destroyed due to charging damage. Likewise, it is also possible to avoid plasma damage to the members disposed within the process chamber 201. This makes it possible to reduce the maintenance cost of the substrate processing apparatus.

(f) By using the halosilane precursor gas such as the BTCSM gas or the like containing a plurality of halogen elements (Cl) in one molecule, it becomes possible to efficiently form the first solid layer and to increase the deposition rate of the SiCN film. Furthermore, it is possible to reduce the consumption amount of the BTCSM gas that does not contribute to the film formation. This makes it possible to reduce the cost for forming film forming.

(g) By using the alkylene halosilane precursor gas such as the BTCSM gas or the like which is small in the molecular weight (molecular size) of alkylene groups contained in one molecule, it is possible to further increase the deposition rate and to form a strong film. The reasons are as follows. For example, in case of using an alkylene halosilane precursor gas which contains, in one molecule, alkylene groups such as hexylene groups or heptylene groups having a large molecular weight, the alkylene groups having a large molecular weight may sometimes cause steric hindrance that inhibits the reaction of Si contained in the precursor gas, thereby inhibiting formation of the first solid layer. Moreover, if the aforementioned alkylene groups remain in the first solid layer in a non-decomposed state or an only partially decomposed state, the alkylene groups having a large molecular weight may sometimes cause steric hindrance that inhibits the reaction of Si contained in the first layer with the NH$_3$ gas, thereby inhibiting a formation of the second solid layer. In contrast, by using the alkylene halosilane precursor gas such as the BTCSM gas or the like which is small in the molecular weight of alkylene groups contained in one molecule, it is possible to prevent the aforementioned steric hindrance from being generated and to promote the formation of the first solid layer and the second solid layer. Consequently, it is possible to increase a deposition rate and to form a SiCN film which has strong bonds between atoms making up the film. The same effect is obtained in case of using an alkyl halosilane precursor gas such as a TCDMDS gas or the like which is small in the molecular weight of alkyl groups contained in one molecule.

(h) By using the precursor gas such as the BTCSM gas or the like containing two Si atoms in one molecule, the finally-formed SiCN film can be made a film in which Si atoms adjoin one another. The reasons are as follows. When forming the first solid layer under a condition in which the BTCSM gas is not autolyzed, two Si atoms contained in a BTCSM gas molecule are adsorbed onto the wafer 200 (the base film of the surface of the wafer 200) in a mutually adjoining state. Furthermore, when forming the first solid layer under a condition in which the BTCSM gas is autolyzed, two Si atoms contained in a BTCSM gas molecule have strong tendency to be deposited on the wafer 200 in a mutually adjoining state. That is to say, by using the gas such as the BTCSM gas or the like containing two Si atoms in one molecule, as compared with a case where a gas such as a dichlorosilane ($SiH_2Cl_2$, abbreviation: DCS) gas or the like containing only one Si atom in one molecule is used, it is possible to make sure that Si atoms contained in the first solid layer stay in a mutually-adjoining state. Consequently, the SiCN film can be made a film in which Si atoms adjoin one another. This makes it possible to enhance the HF resistance of the film.

(i) By using the precursor gas such as the BTCSM gas or the like acting as a Si source and a C source, and the reaction gas such as the $NH_3$ gas or the like acting as an N source, namely by using two kinds of gases, it is possible to form a film containing three elements, Si, C and N. In other words, when forming a film, there is no need to independently supply three kinds of gases, namely a Si source, a C source and an N source. For that reason, as compared with a case where three kinds of gases are used, it is possible to reduce the number of gas supply steps by one step. This makes it possible to shorten the required time per one cycle and to improve the productivity of a film forming process. Moreover, as compared with a case where three kinds of gases are used, it is possible to reduce the number of gas supply lines to one line. This makes it possible to simplify the structure of the substrate processing apparatus and to reduce the manufacturing cost or the maintenance cost of the substrate processing apparatus.

(j) The BTCSM gas is low in degradability (low in reactivity) and is high in pyrolysis temperature. Therefore, even if a film is formed in a relatively-high temperature zone of, e.g., 650 to 800 degrees C., it is possible to prevent an excessive gas phase reaction. As a result, it is possible to prevent particles within the process chamber 201 from being generated and to improve the substrate processing quality.

(k) By non-simultaneously or alternately performing the supply steps of different gases, it is possible to allow the gases to appropriately contribute to a reaction under a condition in which a gas phase reaction or a surface reaction is properly generated. Consequently, it is possible to improve the step coverage of the SiCN film and the controllability of film thickness control. In addition, it is possible to avoid generation of an excessive gas phase reaction within the process chamber 201 and to prevent particles from being generated.

(l) The aforementioned effects may also be achieved in a case where a precursor gas other than the BTCSM gas, which has an Si—C bond, is used as the precursor gas, a case where a nitrogen-containing gas other than the $NH_3$ gas is used as the reaction gas, or a case where a gas other than the nitrogen-containing gas, e.g., a gas containing N and C, an oxygen-containing gas, a boron-containing gas or a carbon-containing gas, is used as the reaction gas.

(4) Modifications

The film forming sequence according to the present embodiment is not limited to the form illustrated in FIG. 4 and may be modified as in the modifications to be described below.

Modification 1

Figure 5:
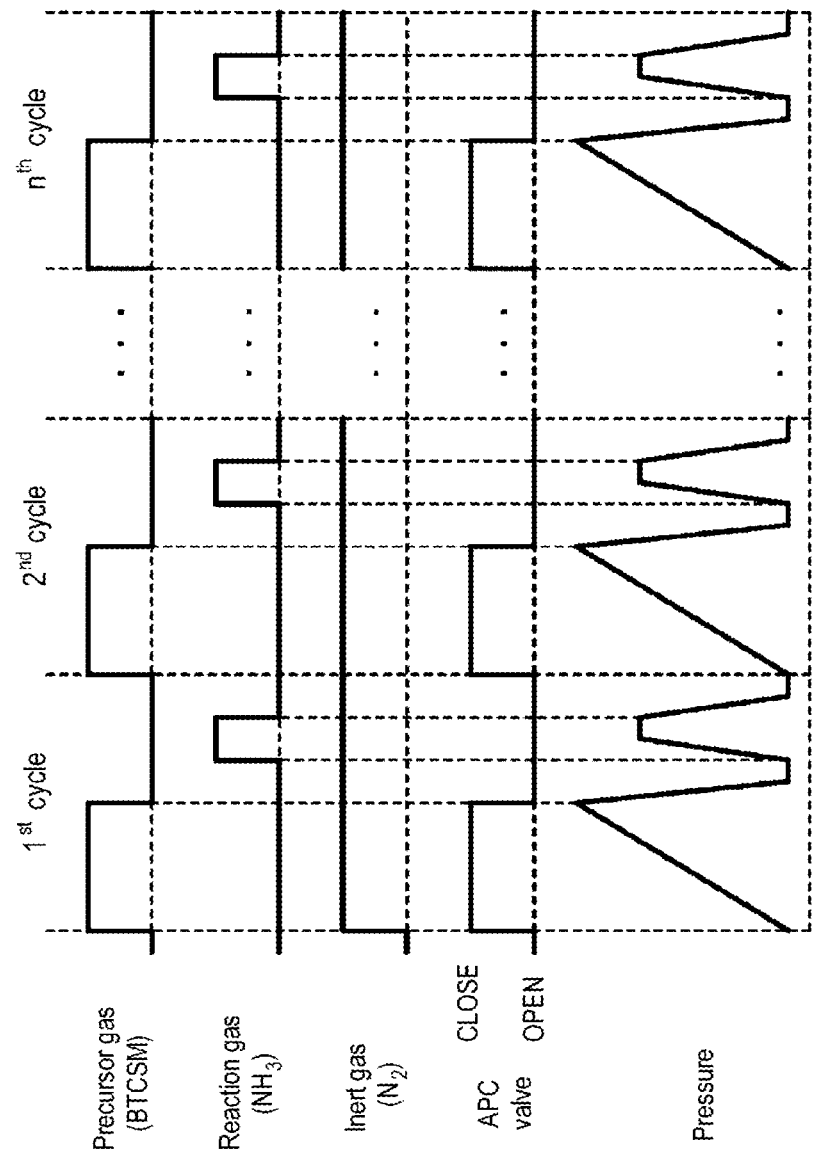
FIG. 5 is a view illustrating gas supply timings and a change of an internal pressure of a process chamber in modification 1 of the film forming sequence according to one embodiment of the present disclosure.

As illustrated in FIG. 5, at the step of confining the BTCSM gas, the internal pressure of the process chamber 201 may be continuously increased by continuously supplying the BTCSM gas into the process chamber 201 while keeping the exhaust system sealed.

If the BTCSM gas is supplied into the process chamber 201 while keeping the exhaust system sealed, the internal pressure of the process chamber 201 continues to increase. By continuously supplying the BTCSM gas while keeping the exhaust system sealed, the ultimately-reached internal pressure of the process chamber 201, i.e., the ultimate internal pressure of the process chamber 201, is set higher than the ultimate internal pressure of the process chamber 201 available when supplying the BTCSM gas at step 1 of the film forming sequence illustrated in FIG. 4. Furthermore, for example, the ultimate internal pressure of the process chamber 201 is set higher than the ultimate internal pressure of the process chamber 201 available when supplying the $NH_3$ gas at step 2. Specifically, the ultimate internal pressure (total internal pressure) of the process chamber 201 is set to fall within a range of, e.g., 10 to 4,666 Pa, specifically, 67 to 4,000 Pa, or more specifically, 133 to 2,666 Pa. By setting the internal pressure of the process chamber 201 so as to fall within this high pressure zone, it becomes possible to efficiently pyrolyze the BTCSM gas supplied into the process chamber 201. In this modification, the processing procedures and processing conditions at the step of supplying the $NH_3$ gas may be the same as those of the film forming sequence illustrated in FIG. 4.

In this modification, the same effects as those of the film forming sequence illustrated in FIG. 4 may be achieved. In addition, since the pyrolysis of the BTCSM gas is promoted by continuously increasing the internal pressure of the process chamber 201 when confining the precursor gas such as the BTCSM gas or the like, it becomes possible to increase the formation rate of the first solid layer, namely the deposition rate of the finally-formed SiCN film. Moreover, by continuously supplying the BTCSM gas into the process chamber 201 when confining the BTCSM gas, it is possible to supplement the BTCSM gas consumed by the pyrolysis, namely to keep the partial pressure of the BTCSM gas within the process chamber 201. This makes it possible to prevent the formation rate of the first solid layer from being reduced, namely reduction of the deposition rate of the finally-formed SiCN film.

Modification 2

Instead of the step of supplying the $NH_3$ gas, it may be possible to perform a step of supplying a gas containing N and C, such as a TEA gas or the like. That is to say, a cycle which non-simultaneously performs a step of confining a BTCSM gas and a step of supplying a gas containing N and C, such as a TEA gas or the like, may be performed a predetermined number of times (n times).

At the step of supplying the TEA gas, the TEA gas is allowed to flow from the gas supply pipe 232b. The opening/closing control of the APC valve 244 and the valves 243b, 243d and 243e is executed in the same manner as the opening/closing control of the APC valve 244 and the valves 243b, 243d and 243e executed at step 2 of the film forming sequence illustrated in FIG. 4. A supply flow rate of the TEA gas controlled by the MFC 241b is set to fall within a range of, e.g., 100 to 10,000 sccm. An internal pressure of the process chamber 201 is set to fall within a range of, e.g., 1 to 5,000 Pa, specifically, 1 to 4,000 Pa. A partial pressure of the TEA gas within the process chamber 201 is set to fall within a range of, e.g., 0.01 to 4,950 Pa. By setting the internal pressure of the process chamber 201 so as to fall within this relatively-high pressure zone, it becomes possible to thermally activate the TEA gas under a non-plasma condition. The time during which the TEA gas is supplied to the wafer 200, namely the gas supply time (irradiation time), is set to fall within a range of, e.g., 1 to 200 seconds, specifically, 1 to 120 seconds, or more specifically, 1 to 60 seconds. Other processing conditions may be the same as, e.g., the processing conditions of step 2 of the film forming sequence illustrated in FIG. 4. Moreover, in this modification, the processing procedures and processing conditions at the step of confining the BTCSM gas may be the same as those of the film forming sequence illustrated in FIG. 4.

By supplying the thermally-activated TEA gas to the wafer 200 under the aforementioned conditions, the first solid layer (the Si-containing layer containing C and Cl) formed on the wafer 200 can react with the TEA gas, thereby modifying the first solid layer. At this time, the N component and the C component contained in the TEA gas are added to the first solid layer, whereby a second solid layer, which is a layer containing Si, C and N, namely a SiCN layer, is formed on the wafer 200. As a result of the introduction of the C component contained in the TEA gas, the second solid layer thus formed becomes a layer having a larger amount of C components than the second solid layer formed in the film forming sequence illustrated in FIG. 4, namely a C-rich layer. If the TEA gas is supplied by thermally activating the same, it is possible to generate a relatively-soft reaction. This makes it possible to relatively softly perform the modification of the first solid layer. For example, when performing the modification of the first solid layer, it is possible to prevent the Si—C bonds contained in the first solid layer from breaking and to prevent desorption of C from the first solid layer.

When forming the SiCN layer, the impurities such as Cl and the like contained in the first solid layer make up a gaseous substance containing at least Cl during the course of the modifying reaction of the first solid layer caused by the TEA gas. The gaseous substance is discharged from the interior of the process chamber 201. That is to say, the impurities such as Cl and the like contained in the first solid layer are extracted or desorbed from the first solid layer, whereby the impurities are separated from the first solid layer. Thus, the SiCN layer becomes a layer which is lower in the amount of impurities such as Cl and the like than the first solid layer.

After the SiCN layer is formed, the valve 243b is closed to stop the supply of the TEA gas. By the same processing procedures as those of step 2 of the film forming sequence illustrated in FIG. 4, the TEA gas, which has not reacted or remains after forming the SiCN layer, or the reaction byproduct, remaining in the process chamber 201, is removed from the interior of the process chamber 201.

As the N- and C-containing gas, in addition to the TEA gas, it may be possible to use e.g., an ethylamine-based gas such as a diethylamine (($C_2H_5$)$_2$NH, abbreviation: DEA) gas, a monoethylamine ($C_2H_5NH_2$, abbreviation: MEA) gas or the like, a methylamine-based gas such as a trimethylamine (($CH_3$)$_3$N, abbreviation: TMA) gas, a dimethylamine (($CH_3$)$_2$NH, abbreviation: DMA) gas, a monomethylamine ($CH_3NH_2$, abbreviation: MMA) gas or the like, a propylamine-based gas such as a tripropylamine (($C_3H_7$)$_3$N, abbreviation: TPA) gas, a dipropylamine (($C_3H_7$)$_2$NH, abbreviation: DPA) gas, a monopropylamine ($C_3H_7NH_2$, abbreviation: MPA) gas or the like, an isopropylamine-based gas such as a triisopropylamine ([($CH_3$)$_2$CH]$_3$N, abbreviation: TIPA) gas, a diisopropylamine ([($CH_3$)$_2$CH]$_2$NH, abbreviation: DIPA) gas, a monoisopropylamine (($CH_3$)$_2$CHNH$_2$, abbreviation: MIPA) gas or the like, a butylamine-based gas such as a tributylamine (($C_4H_9$)$_3$N, abbreviation: TBA) gas, a dibutylamine (($C_4H_9$)$_2$NH, abbreviation: DBA) gas, a monobutylamine ($C_4H_9NH_2$, abbreviation: MBA) gas or the like, and an isobutylamine-based gas such as a triisobutylamine ([($CH_3$)$_2$CHCH$_2$]$_3$N, abbreviation: TIBA) gas, a diisobutylamine ([($CH_3$)$_2$CHCH$_2$]$_2$NH, abbreviation: DIBA) gas, a monoisobutylamine (($CH_3$)$_2$CHCH$_2$NH$_2$, abbreviation: MIBA) gas or the like. That is to say, as the amine-based gas, it may be possible to use, for example, at least one of the gases expressed by composition formulae, ($C_2H_5$)$_x$NH$_{3-x}$, ($CH_3$)$_x$NH$_{3-x}$, ($C_3H_7$)$_x$NH$_{3-x}$, [($CH_3$)$_2$CH]$_x$NH$_{3-x}$, ($C_4H_9$)$_x$NH$_{3-x}$, and [($CH_3$)$_2$CHCH$_2$]$_x$NH$_{3-x}$ (where x is an integer of from 1 to 3). In order to increase the C concentration while prevent an increase of the N concentration in the SiCN film, a gas having a molecule in which the number of C atoms is larger than the number of N atoms may be used as the amine-based gas. That is to say, as the amine-based gas, a gas which contains at least one amine selected from a group consisting of TEA, DEA, MEA, TMA, DMA, TPA, DPA, MPA, TIPA, DIPA, MIPA, TBA, DBA, MBA, TIBA, DIBA and MIBA may be used.

As the N- and C-containing gas, in addition to the amine-based gas, it may be possible to use e.g., an organic hydrazine-based gas. In this regard, the organic hydrazine-based gas refers to gaseous organic hydrazine (compound), for example, a gas which is obtained by vaporizing organic hydrazine staying in a liquid state under room temperature and atmospheric pressure or a gas which contains a hydrazine group, such as organic hydrazine or the like staying in a gaseous state under room temperature and atmospheric pressure. The organic hydrazine-based gas may be simply referred to as an organic hydrazine gas or an organic hydrazine compound gas. The organic hydrazine-based gas is a Si-free gas composed of three elements, C, N and H, and is a gas which does not contain Si and metal. As the organic hydrazine-based gas, it may be possible to use, for example, a methylhydrazine-based gas such as a monomethylhydrazine (($CH_3$)HN$_2$H$_2$, abbreviation: MMH) gas, a dimethylhydrazine (($CH_3$)$_2$N$_2$H$_2$, abbreviation: DMH) gas, a trimethylhydrazine (($CH_3$)$_2$N$_2$ ($CH_3$)H, abbreviation; TMH) gas or the like, and an ethylhydrazine-based gas such as an ethylhydrazine (($C_2H_5$)HN$_2$H$_2$, abbreviation: EH) gas or the like. In order to increase the C concentration while preventing an increase of the N concentration in the SiCN film, a gas having a molecule in which the number of C atoms is larger than the number of N atoms may be used as the organic hydrazine-based gas.

As the amine-based gas or the organic hydrazine-based gas, a gas having a plurality of C-containing ligands in one molecule, namely a gas having a plurality of hydrocarbon groups such as alkyl groups or the like in one molecule may be used. More specifically, as the amine-based gas or the organic hydrazine-based gas, a gas having three or two C-containing ligands (hydrocarbon groups such as alkyl groups or the like), i.e., organic ligands, in one molecule may be used.

By performing, one or more times (a predetermined number of times), a cycle which non-simultaneously performs the respective steps described above, it is possible to form a SiCN film having a predetermined composition and a predetermined thickness on the wafer 200. As mentioned in respect of the film forming sequence illustrated in FIG. 4, the thickness of the SiCN layer formed per one cycle may be set smaller than a desired film thickness and the aforementioned cycle is repeated a multiple number of times until the desired film thickness is obtained.

According to this modification, the same effects as those of the film forming sequence illustrated in FIG. 4 may be achieved. In addition, by performing the step of supplying the TEA gas which acts as a C source, namely by performing deposition using two kinds of carbon sources (double carbon sources) in one cycle, the SiCN film formed on the wafer 200 can be made a film having a larger amount of C components than the SiCN film formed in the film forming sequence illustrated in FIG. 4, namely a C-rich film. That is to say, it is possible to expand the window of control of the composition ratio of the SiCN film.

Modification 3

Figure 6:
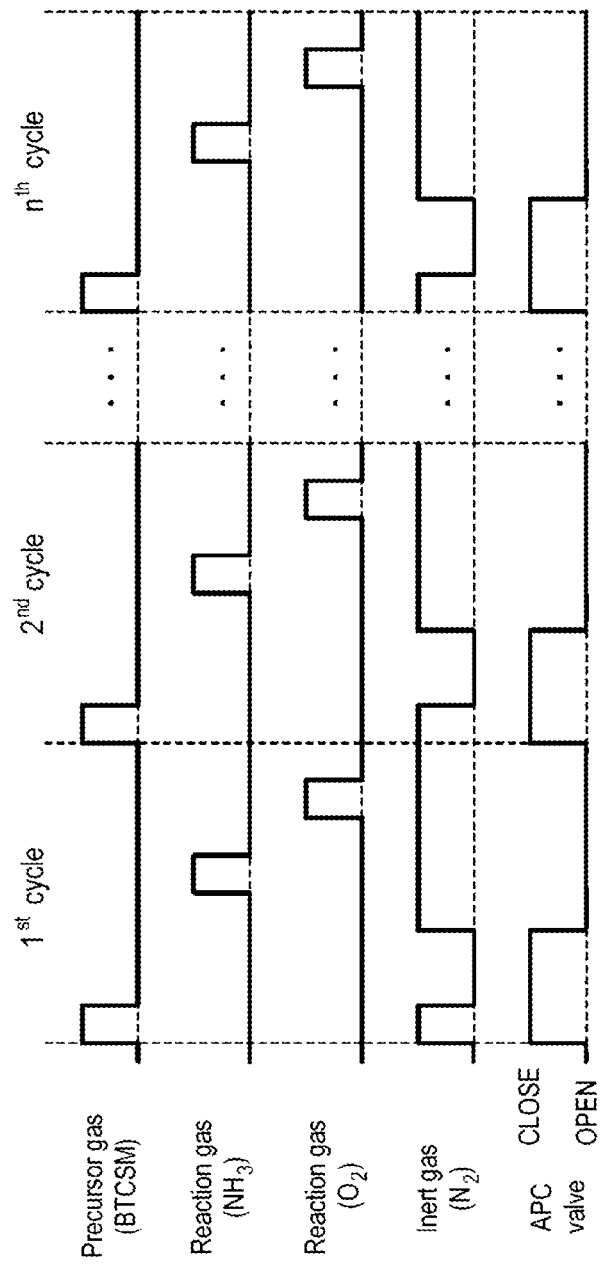
FIG. 6 is a view illustrating gas supply timings in modification 3 of the film forming sequence according to one embodiment of the present disclosure.

As illustrated in FIG. 6, a step of supplying an oxygen-containing gas such as an $O_2$ gas or the like may be additionally performed. That is to say, a cycle which non-simultaneously performs a step of confining a BTCSM gas, a step of supplying a $NH_3$ gas and a step of supplying an oxygen-containing gas such as an $O_2$ gas or the like may be performed a predetermined number of times (n times).

At the step of supplying the $O_2$ gas, the $O_2$ gas is allowed to flow from the gas supply pipe 232b. The opening/closing control of the APC valve 244 and the valves 243b, 243d and 243e is executed in the same manner as the opening/closing control of the APC valve 244 and the valves 243b, 243d and 243e executed at step 2 of the film forming sequence illustrated in FIG. 4. A supply flow rate of the $O_2$ gas controlled by the MFC 241b is set to fall within a range of, e.g., 100 to 10,000 sccm. An internal pressure of the process chamber 201 is set to fall within a range of, e.g., 1 to 4,000 Pa, specifically, 1 to 3,000 Pa. A partial pressure of the $O_2$ gas within the process chamber 201 is set to fall within a range of, e.g., 0.01 to 3,960 Pa. By setting the internal pressure of the process chamber 201 so as to fall within this relatively-high pressure zone, it becomes possible to thermally activate the $O_2$ gas under a non-plasma condition. The time during which the $O_2$ gas is supplied to the wafer 200, namely the gas supply time (irradiation time), is set to fall within a range of, e.g., 1 to 120 seconds, specifically, 1 to 60 seconds. Other processing conditions may be the same as, e.g., the processing conditions of step 2 of the film forming sequence illustrated in FIG. 4. Moreover, in this modification, the processing procedures and processing conditions at the step of confining the BTCSM gas and at the step of supplying the $NH_3$ gas may be the same as those of the film forming sequence illustrated in FIG. 4.

By supplying the thermally-activated $O_2$ gas to the wafer 200 under the aforementioned conditions, at least a portion of the second solid layer (the SiCN layer) formed on the wafer 200 is oxidized (modified). As a result of the modification of the SiCN layer, a third solid layer which a layer containing Si, O, C and N, i.e., a silicon oxycarbonitride layer (or a SiOCN layer), is formed on the wafer 200. If the $O_2$ gas is supplied by thermally activating the same, it is possible to generate a relatively-soft reaction. This makes it possible to relatively softly perform oxidation of the second solid layer. For example, when performing oxidation of the second solid layer, it is possible to prevent the Si—C bonds contained in the second solid layer from breaking and to prevent desorption of C from the second solid layer.

When forming the SiOCN layer, the impurities such as Cl and the like contained in the SiCN layer make up a gaseous substance containing at least Cl during the course of the modifying reaction of the SiCN layer caused by the $O_2$ gas. The gaseous substance is discharged from the interior of the process chamber 201. That is to say, the impurities such as Cl and the like contained in the SiCN layer are extracted or desorbed from the SiCN layer, whereby the impurities are separated from the SiCN layer. Thus, the SiOCN layer becomes a layer which is lower in the amount of impurities such as Cl and the like than the SiCN layer.

After the SiOCN layer is formed, the valve 243b is closed to stop the supply of the $O_2$ gas. By the same processing procedures as those of step 2 of the film forming sequence illustrated in FIG. 4, the $O_2$ gas, which has not reacted or remains after forming the SiOCN layer, or the reaction byproduct, remaining within the process chamber 201, is removed from the interior of the process chamber 201.

As the oxygen-containing gas, in addition to the $O_2$ gas, it may be possible to use e.g., a nitrous oxide ($N_2O$) gas, a nitric monoxide (NO) gas, a nitrogen dioxide ($NO_2$) gas, an ozone ($O_3$) gas, a hydrogen ($H_2$)+$O_2$ gas, a $H_2$+$O_3$ gas, a water vapor ($H_2O$), a carbon monoxide (CO) gas, or a carbon dioxide ($CO_2$) gas.

By performing, one or more times (a predetermined number of times), a cycle which non-simultaneously performs the respective steps described above, it is possible to form a silicon oxycarbonitride film (or a SiOCN film) having a predetermined composition and a predetermined thickness, as a film containing Si, O, C and N, on the wafer 200. As mentioned in respect of the film forming sequence illustrated in FIG. 4, the thickness of the SiOCN layer formed per one cycle may be set smaller than a desired film thickness and the aforementioned cycle may be repeated a multiple number of times until the desired film thickness is obtained.

According to this modification, the same effects as those of the film forming sequence illustrated in FIG. 4 may be achieved. In addition, the supply of the $O_2$ gas makes it possible to further desorb the impurities such as Cl and the like from the SiCN layer. It is therefore possible to further reduce the impurity concentration within the finally-formed SiOCN film. As a result, it is possible to further increase the HF resistance of the film.

Modification 4

Instead of the step of supplying the $NH_3$ gas, it may be possible to perform a step of supplying a TEA gas. Furthermore, a step of supplying an $O_2$ gas may be performed. That is to say, a cycle which non-simultaneously performs a step of confining a BTCSM gas, a step of supplying a TEA gas and a step of supplying an $O_2$ gas, may be performed a predetermined number of times (n times). The processing procedures and processing conditions at the respective steps of this modification may be the same as those of the film forming sequence illustrated in FIG. 4 or those of modifications 2 and 3 described above.

A second solid layer (SiCN layer) is formed on the wafer 200 by performing the step of confining the BTCSM gas and the step of supplying the TEA gas. Thereafter, at least a portion of the SiCN layer formed on the wafer 200 is oxidized (modified) by performing the step of supplying the $O_2$ gas. At this time, if the oxidizing power is increased by, for example, increasing the internal pressure of the process chamber 201, it is possible to desorb most of the N atoms contained in the SiCN layer such that the N atoms exist at an impurity level. It is also possible to substantially extinguish the N atoms contained in the SiCN layer. Thus, the SiCN layer is modified into a third solid layer which is a SiOCN layer or a layer containing Si, 0 and C, namely a silicon oxycarbide layer (SiOC layer). If the $O_2$ gas is supplied by thermally activating the same under a non-plasma condition, it is possible to softly generate the aforementioned reaction. This makes it easy to form the SiOCN layer or the SiOC layer. According to this modification, a SiOCN film or a film containing Si, O and C, namely a silicon oxycarbide film (SiOC film) is formed on the wafer 200.

According to this modification, the same effects as those of the film forming sequence illustrated in FIG. 4 and those of modifications 2 and 3 may be achieved. In addition, according to this modification, the supply of the $O_2$ gas makes it possible to further desorb the impurities such as Cl and the like from the SiCN layer. It is therefore possible to reduce the impurity concentration within the SiOCN film or the SiOC film. As a result, it is possible to further increase the HF resistance of the film.

Modification 5

Instead of the step of supplying the $NH_3$ gas, it may be possible to perform a step of supplying an $O_2$ gas. That is to say, a cycle which non-simultaneously performs a step of confining a BTCSM gas and a step of supplying an $O_2$ gas, may be performed a predetermined number of times (n times). The processing procedures and processing conditions at the respective steps of this modification may be the same as those of the film forming sequence illustrated in FIG. 4 or those of modification 3 described above.

A first solid layer (a Si-containing layer containing C and Cl) is formed on the wafer 200 by performing the step of confining the BTCSM gas. Thereafter, at least a portion of the first solid layer formed on the wafer 200 is oxidized (modified) by performing the step of supplying the $O_2$ gas. As a result of the modification of the first solid layer, a SiOC layer as a second solid layer is formed on the wafer 200. According to this modification, a SiOC film is formed on the wafer 200.

According to this modification, the same effects as those of the film forming sequence illustrated in FIG. 4 may be achieved. In addition, according to this modification, the supply of the $O_2$ gas makes it possible to desorb the impurities such as Cl and the like from the first solid layer. It is therefore possible to reduce the impurity concentration within the finally-formed SiOC film. As a result, it is possible to increase the HF resistance of the film.

Modification 6

A step of supplying a borane-based gas such as a $BCl_3$ gas or the like may be performed between the step of confining the BTCSM gas and the step of supplying the $NH_3$ gas. That is to say, a cycle which non-simultaneously performs a step of confining a BTCSM gas, a step of supplying a borane-based gas such as a $BCl_3$ gas or the like and a step of supplying a $NH_3$ gas, may be performed a predetermined number of times (n times). In this modification, the processing procedures and processing conditions at the step of confining the BTCSM gas and the step of supplying the $NH_3$ gas may be the same as those of the film forming sequence illustrated in FIG. 4.

At the step of supplying the $BCl_3$ gas, the $BCl_3$ gas is allowed to flow from the gas supply pipe 232b. The opening/closing control of the APC valve 244 and the valves 243b, 243d and 243e is executed in the same manner as the opening/closing control of the APC valve 244 and the valves 243b, 243d and 243e executed at step 2 of the film forming sequence illustrated in FIG. 4. A supply flow rate of the $BCl_3$ gas controlled by the MFC 241b is set to fall within a range of, e.g., 100 to 10,000 sccm. An internal pressure of the process chamber 201 is set to fall within a range of, e.g., 1 to 2,666 Pa, specifically, 67 to 1,333 Pa. A partial pressure of the $BCl_3$ gas within the process chamber 201 is set to fall within a range of, e.g., 0.01 to 2,640 Pa. The time during which the $BCl_3$ gas is supplied to the wafer 200, namely the gas supply time (irradiation time), is set to fall within a range of, e.g., 1 to 120 seconds, specifically, 1 to 60 seconds. Other processing conditions may be the same as, e.g., the processing conditions of step 2 of the film forming sequence illustrated in FIG. 4.

By supplying the $BCl_3$ gas to the wafer 200 under the aforementioned conditions, a B-containing layer having a thickness of less than one atomic layer, namely a discontinuous B-containing layer, is formed on the surface of the first solid layer (the Si-containing layer containing C and Cl) formed on the wafer 200. The B-containing layer may be a B layer, a chemisorption layer of the $BCl_3$ gas, or both. As a result of the formation of the B-containing layer on the surface of the first solid layer, a layer containing Si, B and C is formed on the wafer 200. Since the $BCl_3$ gas is a non-borazine-based boron-containing gas, the layer containing Si, B and C becomes a borazine-ring-skeleton-free layer. If the $BCl_3$ gas is supplied by thermally activating the same under a non-plasma condition, it is possible to softly generate the aforementioned reaction. This makes it easy to form the layer containing Si, B and C.

As the borazine-ring-skeleton-free boron-containing gas, it may be possible to use a halogenated boron-based gas (haloborane-based gas) other than the $BCl_3$ gas, e.g., a chloroborane-based gas other than the $BCl_3$ gas, a fluoroborane-based gas such as a trifluoroborane ($BF_3$) gas or the like, and a bromoborane-based gas such as a tribromoborane ($BBr_3$) gas or the like. It is also possible to use a borane-based gas such as a $B_2H_6$ gas or the like. It is also possible to use an organic borane-based gas in addition to the inorganic borane-based gas.

After the layer containing Si, B and C is formed, the valve 243b is closed to stop the supply of the $BCl_3$ gas. By the same processing procedures as those of step 2 of the film forming sequence illustrated in FIG. 4, the $BCl_3$ gas, which has not reacted or remains after forming the layer containing Si, B and C, or the reaction byproduct, remaining within the process chamber 201, is removed from the interior of the process chamber 201.

Thereafter, the step of supplying the $NH_3$ gas to the wafer 200, namely the layer containing Si, B and C, is performed. Thus, the layer containing Si, B and C is modified into a second solid layer which is a layer containing Si, B, C and N, namely a silicon borocarbonitride layer (SiBCN layer).

By performing, one or more times (a predetermined number of times), a cycle which non-simultaneously performs the respective steps described above, it is possible to form a silicon borocarbonitride film (or a SiBCN film) having a predetermined composition and a predetermined thickness, as a film containing Si, B, C and N, on the wafer 200. As mentioned in respect of the film forming sequence illustrated in FIG. 4, the thickness of the SiBCN layer formed per one cycle may be set smaller than a desired film thickness and the aforementioned cycle may be repeated a multiple number of times until the desired film thickness is obtained.

According to this modification, the same effects as those of the film forming sequence illustrated in FIG. 4 and those of the respective modifications described above may be achieved. In addition, the addition of B to the film formed on the wafer 200 makes it possible to further increase, e.g., the HF resistance of the film.

Modification 7

A step of supplying a TEA gas may be performed instead of the step of supplying the $NH_3$ gas, and a step of supplying a BCl₃ gas may be performed between the step of confining the BTCSM gas and the step of supplying the TEA gas. That is to say, a cycle which non-simultaneously performs a step of confining a BTCSM gas, a step of supplying a BCl₃ gas and a step of supplying a TEA gas, may be performed a predetermined number of times (n times). According to this modification, a SiBCN film is formed on the wafer 200. The processing procedures and processing conditions at the respective steps of this modification may be the same as those of the film forming sequence illustrated in FIG. 4 and those of modifications 2 and 6.

According to this modification, the same effects as those of the film forming sequence illustrated in FIG. 4 and those of modification 6 may be achieved. In addition, by performing the step of supplying the TEA gas, the SiBCN film formed on the wafer 200 can be made a film having a larger amount of C components than the SiBCN film formed in modification 6, namely a C-rich film. That is to say, it is possible to expand the window of control of the composition ratio of the SiBCN film.

Modification 8

A step of supplying a borazine-based gas such as a TMB gas or the like may be performed instead of the step of supplying the NH₃ gas. That is to say, a cycle which non-simultaneously performs a step of confining a BTCSM gas and a step of supplying a borazine-based gas such as a TMB gas or the like, may be performed a predetermined number of times (n times). In this modification, the processing procedures and processing conditions at the step of confining the BTCSM gas may be the same as those of the film forming sequence illustrated in FIG. 4.

At the step of supplying the TMB gas, the TMB gas is allowed to flow from the gas supply pipe 232b. The opening/closing control of the APC valve 244 and the valves 243b, 243d and 243e is executed in the same manner as the opening/closing control of the APC valve 244 and the valves 243b, 243d and 243e executed at step 2 of the film forming sequence illustrated in FIG. 4. A supply flow rate of the TMB gas controlled by the MFC 241b is set to fall within a range of, e.g., 1 to 1,000 sccm. An internal pressure of the process chamber 201 is set to fall within a range of, e.g., 1 to 2,666 Pa, specifically, 67 to 1,333 Pa. A partial pressure of the TMB gas within the process chamber 201 is set to fall within a range of, e.g., 0.0001 to 2,424 Pa. The time during which the TMB gas is supplied to the wafer 200, namely the gas supply time (irradiation time), is set to fall within a range of, e.g., 1 to 120 seconds, specifically, 1 to 60 seconds. Other processing conditions may be the same as, e.g., the processing conditions of step 2 of the film forming sequence illustrated in FIG. 4.

As the TMB gas is supplied to the wafer 200 under the aforementioned conditions, the first solid layer (the Si-containing layer containing C and Cl) reacts with the TMB gas. That is to say, the Cl (chloro group) contained in the first solid layer reacts with the ligand (methyl group) contained in the TMB. Thus, the Cl of the first solid layer reacted with the ligand of the TMB can be separated (extracted) from the first solid layer. The ligand of the TMB reacted with the Cl of the first solid layer can be separated from the TMB. Then, the N that constitutes the borazine ring of the TMB from which the ligand is separated can be bonded to the Si of the first solid layer. That is to say, among B and N constituting the borazine ring of the TMB, the N caused to have a dangling bond due to the separation of the methyl ligand may be bonded to the Si included in the first solid layer and caused to have a dangling bond or the Si originally provided with a dangling bond, thereby forming a Si—N bond. At this time, the borazine ring skeleton constituting the borazine ring of the TMB is maintained without being broken.

By supplying the TMB gas under the aforementioned conditions, it is possible to have the first solid layer and the TMB properly react with each other while maintaining the borazine ring skeleton of the TMB without destroying the same. This makes it possible to generate the series of reactions described above. Most important factors (conditions) for generating the series of reactions while maintaining the borazine ring skeleton of the TMB are considered to be the temperature of the wafer 200 and the internal temperature of the process chamber 201, particularly the temperature of the wafer 200. By appropriately controlling those factors, it becomes possible to generate appropriate reactions.

Through the series of reactions, the borazine ring is newly introduced into the first solid layer, and the first solid layer is changed (or modified) into a second solid layer which is a layer including a borazine ring skeleton and containing Si, B, C, and N, namely a silicon borocarbonitride layer (SiBCN layer) having a borazine ring skeleton. The SiBCN layer including a borazine ring skeleton becomes a layer having a thickness of, e.g., from less than one atomic layer to several atomic layers. The SiBCN layer including a borazine ring skeleton may also be referred to as a layer containing Si, C and a borazine ring skeleton.

As the borazine ring is newly introduced into the first solid layer, the B component and the N component constituting the borazine ring are introduced into the first solid layer. At this time, the C component contained in the ligand of the TMB is also introduced into the first solid layer. That is to say, if the borazine ring is introduced into the first solid layer by causing the first solid layer and the TMB to react with each other, it is possible to add the B component, the C component and the N component to the first solid layer.

During the formation of the SiBCN layer including a borazine ring skeleton, the Cl which was contained in the first solid layer or the H which was contained in the TMB gas forms a gaseous substance containing at least Cl or H in the course of the modifying reaction of the first solid layer caused by the TMB gas. The gaseous substance thus formed is discharged from the interior of the process chamber 201. That is to say, the impurities such as Cl and the like contained in the first solid layer are extracted or desorbed from the first solid layer and are eventually separated from the first solid layer. Thus, the SiBCN layer including a borazine ring skeleton becomes a layer which is smaller in the amount of impurities such as Cl and the like than the first solid layer.

During the formation of the SiBCN layer including a borazine ring skeleton, if the borazine ring skeleton that constitutes the borazine ring of the TMB is maintained without destroying the same, it is possible to maintain a central space of the borazine ring. Thus, a porous SiBCN layer can be formed.

After the SiBCN layer including a borazine ring skeleton is formed, the valve 243b is closed to stop the supply of the TMB gas. Then, the TMB gas, which has not reacted or remains after forming the SiBCN layer including a borazine ring skeleton, or the reaction byproduct, which remains within the process chamber 201, is removed from the interior of the process chamber 201 by the same processing procedures as those of step 2 of the film forming sequence illustrated in FIG. 4.

As the gas containing a borazine ring skeleton, in addition to the TMB gas, it may be possible to use e.g., a TEB gas, a TPB gas, a TIPB gas, a TBB gas or a TIBB gas.

By performing, one or more times (a predetermined number of times), a cycle which non-simultaneously performs the respective steps described above, it is possible to form a SiBCN film having a predetermined composition and a predetermined thickness and including a borazine ring skeleton on the wafer 200. As mentioned in respect of the film forming sequence illustrated in FIG. 4, the thickness of the SiBCN layer formed per cycle may be set smaller than a desired film thickness and the aforementioned cycle is repeated a multiple number of times until the desired film thickness is obtained.

According to this modification, the same effects as those of the film forming sequence illustrated in FIG. 4 and those of modifications 6 and 7 may be achieved. In addition, the film formed on the wafer 200 is made a film including a borazine ring skeleton, namely a porous film having a low atomic density. It is therefore possible to make the dielectric constant of the film lower than the dielectric constant of the SiBCN film formed in, e.g., modifications 6 and 7. Moreover, the film formed on the wafer 200 is made a film including a borazine ring skeleton, namely a film containing B as one component of the borazine ring skeleton that constitutes the film. This makes it possible to improve the oxidation resistance of the film.

Modification 9

A step of supplying a TMB gas may be performed between the step of confining the BTCSM gas and the step of supplying the $NH_3$ gas. That is to say, a cycle which non-simultaneously performs a step of confining a BTCSM gas, a step of supplying a TMB gas and a step of supplying a $NH_3$ gas, may be performed a predetermined number of times (n times). The processing procedures and processing conditions at the respective steps of this modification may be the same as those of the film forming sequence illustrated in FIG. 4 and those of modification 8.

By performing the step of confining the BTCSM gas and the step of supplying the TMB gas, a second solid layer (or a SiBCN layer containing a borazine ring skeleton) is formed on the wafer 200. Thereafter, at least a portion of the SiBCN layer containing a borazine ring skeleton, which is formed on the wafer 200, is nitrided (modified) by performing the step of supplying the $NH_3$ gas. Thus, the SiBCN layer containing a borazine ring skeleton is modified into a third solid layer which is an N-rich SiBCN layer containing a borazine ring skeleton. According to this modification, an N-rich SiBCN film containing a borazine ring skeleton is formed on the wafer 200.

According to this modification, the same effects as those of the film forming sequence illustrated in FIG. 4 and those of modification 8 may be achieved. In addition, according to this modification, the supply of the $NH_3$ gas makes it possible to desorb the impurities such as Cl and the like from the second solid layer and to reduce the impurity concentration within the finally-formed film. As a result, it is possible to enhance the HF resistance of the film.

Modifications 10 to 14

Figure 7:
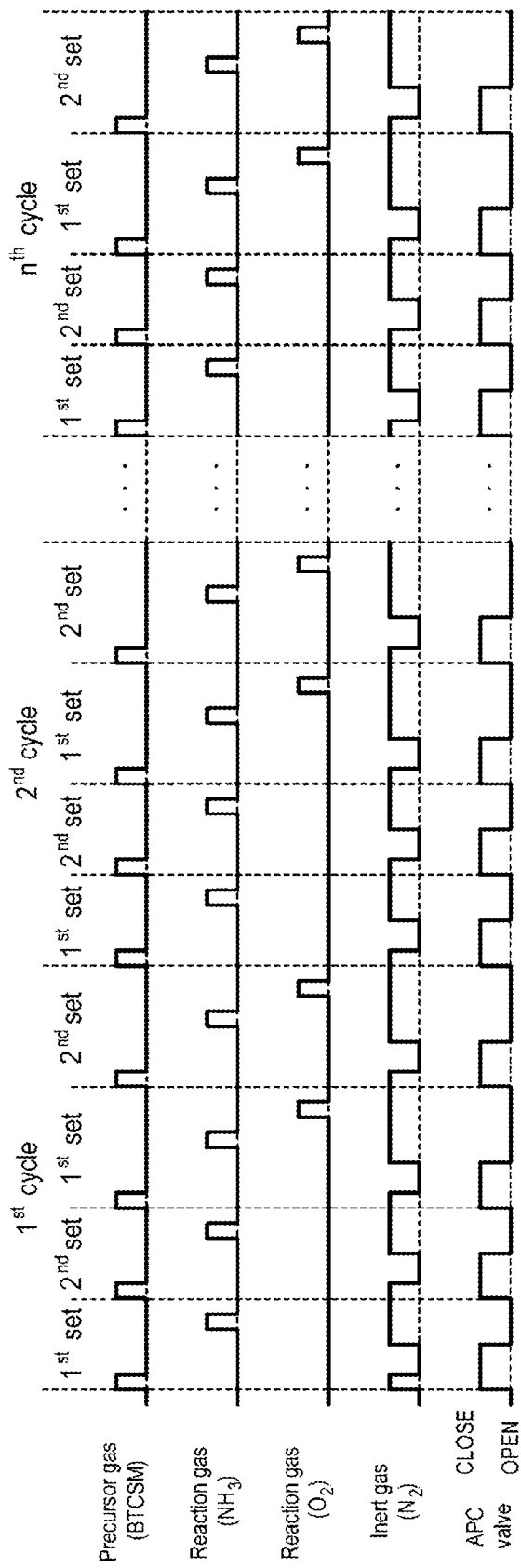
FIG. 7 is a view illustrating gas supply timings in modification 10 of the film forming sequence according to one embodiment of the present disclosure.

As illustrated in FIG. 7, a laminated film (or a SiOCN film) composed of a first film and a second film alternately laminated at a nano level may be formed on the wafer 200 by performing, a predetermined number of times (n times), a cycle which includes:

a step of forming a SiCN film as the first film by performing, a predetermined number of times ($m_1$ times), a set which non-simultaneously performs a step of confining a BTCSM gas and a step of supplying a $NH_3$ gas; and a step of forming a SiOCN film as the second film by performing, a predetermined number of times ($m_2$ times), a set which non-simultaneously performs a step of confining a BTCSM gas, a step of supplying a $NH_3$ gas and a step of supplying an $O_2$ gas (Modification 10). FIG. 7 illustrates an example where the performing times (m1 times or m2 times) of each of the sets are two times.

Figure 8:
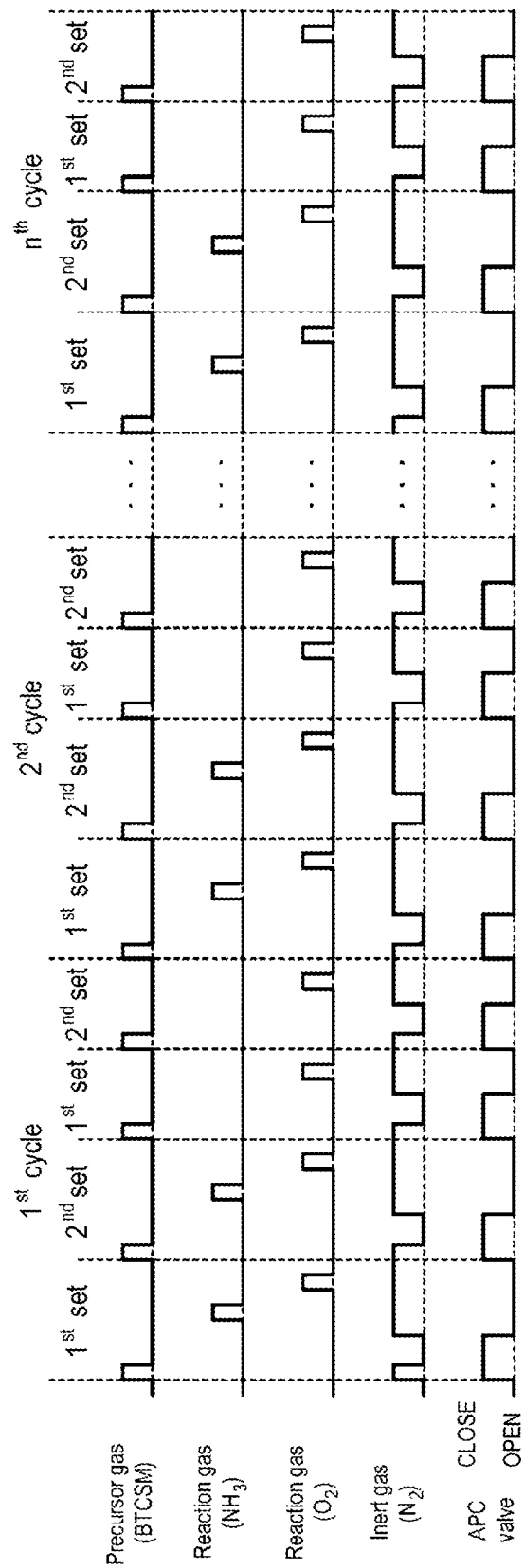
FIG. 8 is a view illustrating gas supply timings in modification 11 of the film forming sequence according to one embodiment of the present disclosure.

Furthermore, as illustrated in FIG. 8, a laminated film (or a SiOCN film) composed of a first film and a second film alternately laminated at a nano level may be formed on the wafer 200 by performing, a predetermined number of times (n times), a cycle which includes:

a step of forming a SiOCN film as the first film by performing, a predetermined number of times ($m_1$ times), a set which non-simultaneously performs a step of confining a BTCSM gas, a step of supplying a $NH_3$ gas and a step of supplying an $O_2$ gas; and a step of forming a SiOC film as the second film by performing, a predetermined number of times ($m_2$ times), a set which non-simultaneously performs a step of confining a BTCSM gas and a step of supplying an $O_2$ gas (Modification 11). FIG. 8 illustrates an example where the performing times (m1 times or m2 times) of each of the sets are two times.

Figure 9:
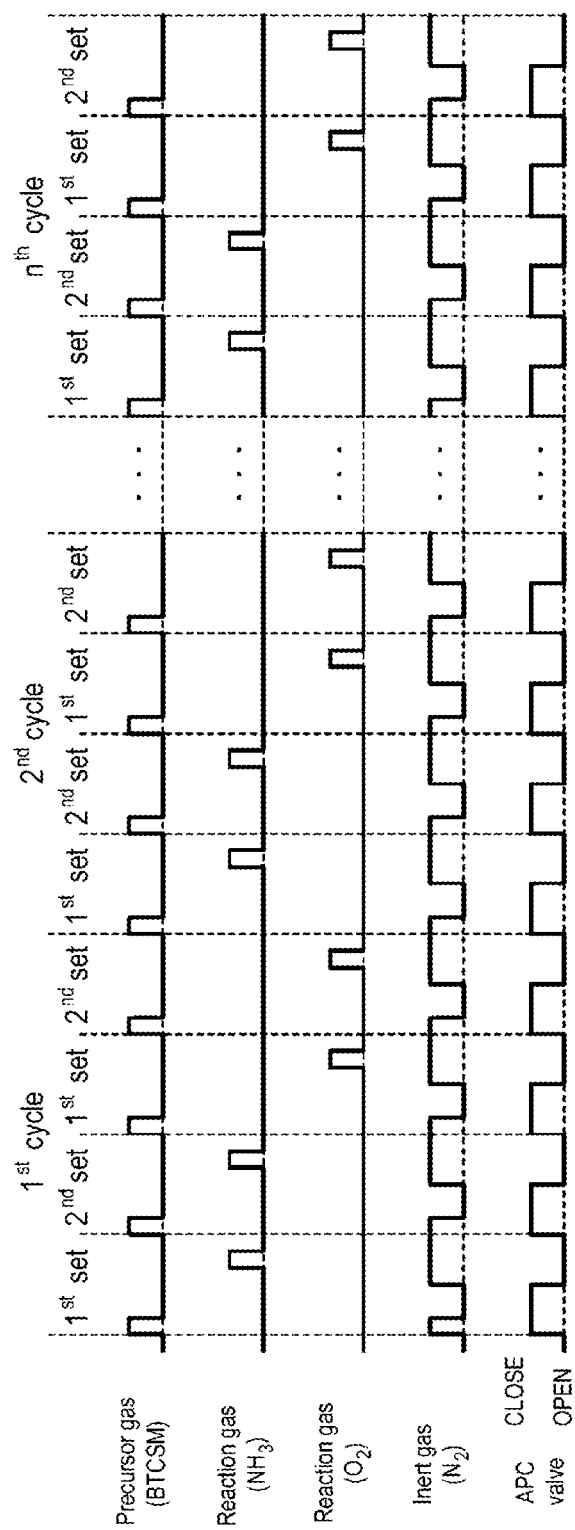
FIG. 9 is a view illustrating gas supply timings in modification 12 of the film forming sequence according to one embodiment of the present disclosure.

Moreover, as illustrated in FIG. 9, a laminated film (or a SiOCN film) composed of a first film and a second film alternately laminated at a nano level may be formed on the wafer 200 by performing, a predetermined number of times (n times), a cycle which includes:

a step of forming a SiCN film as the first film by performing, a predetermined number of times ($m_1$ times), a set which non-simultaneously performs a step of confining a BTCSM gas and a step of supplying a $NH_3$ gas; and a step of forming a SiOC film as the second film by performing, a predetermined number of times ($m_2$ times), a set which non-simultaneously performs a step of confining a BTCSM gas and a step of supplying an $O_2$ gas (Modification 12). FIG. 9 illustrates an example where the performing times (m1 times or m2 times) of each of the sets are two times.

In addition, a laminated film (or a borazine-ring-skeleton-free SiBCN film) composed of a first film and a second film alternately laminated at a nano level may be formed on the wafer 200 by performing, a predetermined number of times (n times), a cycle which includes:

a step of forming a SiCN film as the first film by performing, a predetermined number of times ($m_1$ times), a set which non-simultaneously performs a step of confining a BTCSM gas and a step of supplying a $NH_3$ gas; and a step of forming a borazine-ring-skeleton-free SiBCN film as the second film by performing, a predetermined number of times ($m_2$ times), a set which non-simultaneously performs a step of confining a BTCSM gas, a step of supplying a $BCl_3$ gas and a step of supplying an $NH_3$ gas (Modification 13).

Furthermore, a laminated film (or a borazine-ring-skeleton-containing SiBCN film) composed of a first film and a second film alternately laminated at a nano level may be formed on the wafer 200 by performing, a predetermined number of times (n times), a cycle which includes:

a step of forming a borazine-ring-skeleton-free SiBCN film as the first film by performing, a predetermined number of times ($m_1$ times), a set which non-simultaneously performs a step of confining a BTCSM gas, a step of supplying a $BCl_3$ gas and a step of supplying an $NH_3$ gas; and a step of forming a borazine-ring-skeleton-containing SiBCN film as the second film by performing, a predetermined number of times ($m_2$ times), a set which non-simultaneously performs a step of confining a BTCSM gas and a step of supplying a TMB gas (Modification 14).

The processing procedures and processing conditions at the respective steps of modifications 10 to 14 may be the same as those of the film forming sequence illustrated in FIG. 4 and those of the respective steps of modifications 2 to 9. In modifications 10 to 14, the performing times (m1 times or m2 times) of each of the sets are controlled such that the thickness of the first film and the second film becomes, e.g., 5 nm or less, specifically, 1 nm or less.

In modifications 10 to 14, the same effects as those of the film forming sequence illustrated in FIG. 4 and those of modifications 2 to 9 may be achieved.

By alternately laminating the first film and the second film, it becomes possible to improve the controllability of the composition ratio control of the finally-formed laminated film. For example, by making the C concentration in the first film and the C concentration in the second film differ from each other, it becomes possible to control the C concentration in the finally-formed laminated film so as to become an arbitrary concentration between the C concentration in the first film and the C concentration in the second film. At this time, for example, by controlling the ratio of the thickness of the first film to the thickness of the second film, it becomes possible to finely adjust the C concentration in the finally-formed laminated film. That is to say, by alternately laminating the first film and the second film, it becomes possible to control the composition ratio of the finally-formed laminated film so as to become a value which cannot be realized in a case where a single film is formed on the wafer 200 in the same method as used in forming the first film or a case where a single film is formed on the wafer 200 in the same method as used in forming the second film. In other words, it is possible to expand the composition ratio control window.

Furthermore, the finally-formed laminated film can be made a film having the properties of one or both of the first film and the second film, a film having the intermediate properties between the first film and the second film, or a film having the properties differing from the properties of the first film or the second film. In these cases, as set forth above, the thickness of the first film and the second film may be set at, e.g., 0.1 nm or more and 5 nm or less, specifically, 0.1 nm or more and 1 nm or less.

It is difficult to set the thickness of the first film and the second film at a thickness of less than 0.1 nm. Furthermore, if the thickness of one of the first film and the second film is set at a thickness of more than 5 nm, there may be a case where the finally-formed laminated film becomes a film having non-uniform (inconsistent) properties in the laminating direction, namely a film whose properties are made distinct in the laminating direction due to the mere lamination of the first film and the second film. By setting the thickness of the first film and the second film at 0.1 nm or more and 5 nm or less, specifically, 0.1 nm or more and 1 nm or less, the finally-formed laminated film can be made a film having consistent properties in the laminating direction, namely a film in which the properties and natures of the first film and the second film are properly fused. That is to say, by setting the thickness of the first film and the second film at a thickness which falls within the aforementioned range, the finally-formed laminated film can be made a nano laminate film having integral and inseparable properties in the film as a whole. In addition, if the performing times ($m_1$ times or $m_2$ times) of each of the aforementioned sets are set at one or more times and 50 times or less, specifically, at one or more times and 10 times or less, it is possible to set the thickness of the first film and the second film at a thickness which falls within the aforementioned range.

Furthermore, in modification 14, one or more effects set forth below may be achieved.

(a) By alternately laminating the first film and the second film, it becomes possible to enhance the controllability when controlling the ratio of the B component and the N component (hereinafter also referred to as a "B/N ratio"). The reasons are as follows. The B/N ratio of the second film formed through the use of the BTCSM gas and the TMB gas is decided depending on the ratio of the numbers of B atoms and N atoms contained in one molecule of the TMB gas (the ratio being 1/1 in the TMB gas), namely the kind of the gas containing a borazine ring skeleton. It is difficult to control the B/N ratio so as to become a value which is far away from this value. In contrast, the B/N ratio of the first film formed through the use of the BTCSM gas, the $BCl_3$ gas and the $NH_3$ gas can be freely controlled by, for example, adjusting the flow rate ratio of the $BCl_3$ gas and the $NH_3$ gas. Thus, if the B/N ratio of the first film and the B/N ratio of the second film are made different from each other when alternately laminating the first film and the second film, it is possible to control the B/N ratio of the finally-formed SiBCN film so as to become an arbitrary value between the B/N ratio of the first film and the B/N ratio of the second film.

(b) By alternately laminating the first film and the second film, it is possible to enhance the controllability of the film density of the finally-formed SiBCN film, namely the in-film atomic density. As a result, it becomes possible to enhance the controllability of the dielectric constant control of the finally-formed SiBCN film. The reasons are as follows. The borazine-ring-skeleton-containing second film (the porous film) becomes a film which is lower in the in-film atomic density and in the dielectric constant than the borazine-ring-skeleton-free first film (the non-porous film). Thus, by alternately laminating the first film and the second film, it is possible to control the dielectric constant of the finally-formed SiBCN film so as to become, e.g., an arbitrary value between the dielectric constant of the borazine-ring-skeleton-containing SiBCN film (single film) formed through the use of the BTCSM gas and the TMB gas and the dielectric constant of the borazine-ring-skeleton-free SiBCN film (single film) formed through the use of the BTCSM gas, the $BCl_3$ gas and the $NH_3$ gas. That is to say, by alternately laminating the first film and the second film, it is possible to control the dielectric constant of the finally-formed SiBCN film so as to become a value which cannot be realized in a case where a single film is formed through the use of the BTCSM gas and the TMB gas or a case where a single film is formed through the use of the BTCSM gas, the $BCl_3$ gas and the $NH_3$ gas. This makes it possible to expand the dielectric constant control window. In addition, by controlling the ratio of the thickness of the first film and the thickness of the second film, it is possible to finely adjust the dielectric constant of the finally-formed SiBCN film.

(c) By alternately laminating the first film and the second film, it is possible to improve the surface roughness of the finally-formed SiBCN film. The term "surface roughness" means the height difference in a wafer surface or in an arbitrary object surface. The surface roughness has the same meaning as the surface coarseness. By stating that the surface roughness is improved (good), it is meant that the height difference is reduced (small), namely that the surface is smoothened (smooth). By stating that the surface roughness is worsened (poor), it is meant that the height difference is increased (large), namely that the surface is roughened (rough). There is a tendency that the borazine-ring-skeleton-free first film becomes better in the surface roughness than the borazine-ring-skeleton-containing second film. Thus, by alternately laminating the first film and the second film, it becomes possible to improve the surface roughness of the finally-formed SiBCN film. That is to say, by alternately laminating the first film and the second film, it is possible to make the surface roughness of the finally-formed SiBCN film higher than the surface roughness of the borazine-ring-skeleton-containing SiBCN film (single film) formed through the use of the BTCSM gas and the TMB gas.

At this time, if the formation of the borazine-ring-skeleton-free first film is performed prior to the formation of the borazine-ring-skeleton-containing second film, it is possible to further improve the surface roughness of the finally-formed SiBCN film. That is to say, if the first film having good surface roughness is formed as a base of the second film prior to forming the second film and if the second film is formed on the first film, the second film is affected by the base. This makes it possible to improve the surface roughness of the second film. As a result, it becomes possible to further improve the surface roughness of the finally-formed SiBCN film.

Furthermore, at this time, if the borazine-ring-skeleton-free first film is finally formed, it becomes possible to further improve the surface roughness of the finally-formed SiBCN film. That is to say, if the finally-formed SiBCN film, i.e., the uppermost portion of the laminated film, is configured by the first film having good surface roughness, it becomes possible to further improve the surface roughness of the finally-formed SiBCN film.

In addition, at this time, if the thickness of the first film and the second film is set smaller, namely if the performing times ($m_1$ times or $m_2$ times) of each of the aforementioned sets is set smaller, it becomes possible to further improve the surface roughness of the finally-formed SiBCN film.

(d) By alternately laminating the first film and the second film, it is possible to improve the controllability of the oxidation resistance of the finally-formed SiBCN film. The reasons are as follows. The borazine-ring-skeleton-containing second film contains B as one constituent element of the borazine ring skeleton constituting the second film. The B—N bond constituting the borazine ring skeleton is strong. For that reason, the second film is smaller in the amount of desorption of B from the film by oxidation than the first film. Thus, the second film becomes a film which is high in the oxidation resistance, e.g., in the resistance to oxygen plasma, namely a film which is high in the ashing resistance. By alternately laminating the first film and the second film, it is possible to control the oxidation resistance of the finally-formed SiBCN film so as to become, e.g., an arbitrary property between the first film and the second film. That is to say, by alternately laminating the first film and the second film, it is possible to control the oxidation resistance of the finally-formed SiBCN film so as to become a property which cannot be realized in a case where a single film is formed through the use of the BTCSM gas and the TMB gas or a case where a single film is formed through the use of the BTCSM gas, the $BCl_3$ gas and the $NH_3$ gas. That is to say, it is possible to expand the window of oxidation resistance control, i.e., ashing resistance control.

Modification 15

Figure 10:
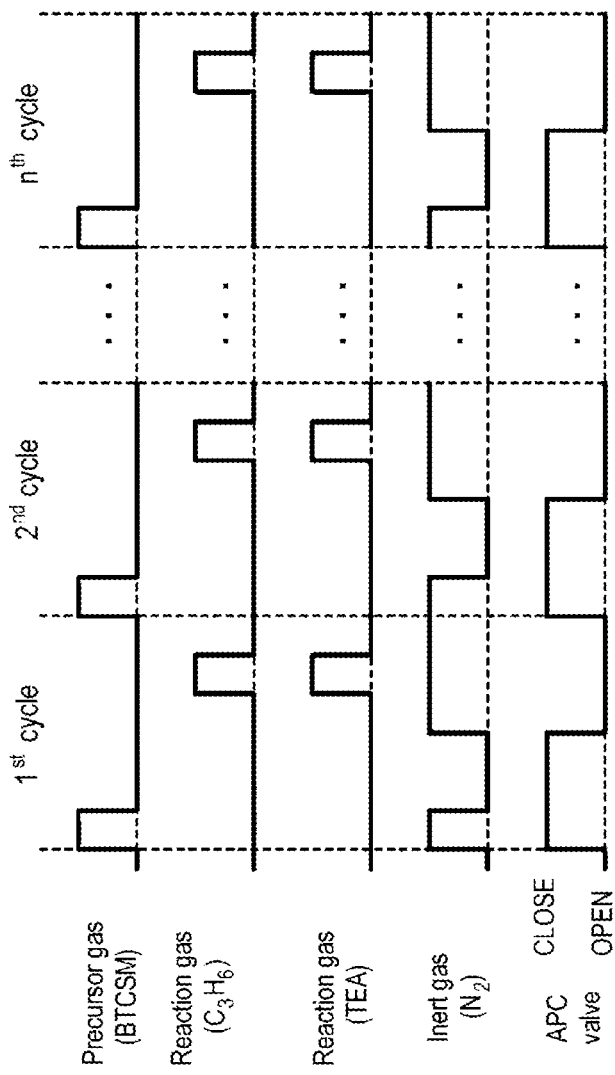
FIG. 10 is a view illustrating gas supply timings in modification 15 of the film forming sequence according to one embodiment of the present disclosure.

In the film forming sequence illustrated in FIG. 4 and the respective modifications described above, a $C_3H_6$ gas as a reaction gas may be supplied simultaneously with a precursor gas such as a BTCSM gas or the like, or simultaneously with a reaction gas such as a $NH_3$ gas, an $O_2$ gas, a TEA gas, a $BCl_3$ gas, a TMB gas or the like. That is to say, a step of supplying a $C_3H_6$ gas may be performed simultaneously with at least one of the steps of supplying the precursor gases and the steps of supplying the reaction gases other than the $C_3H_6$ gas. FIG. 10 illustrates an example where, in modification 2, the step of supplying the $C_3H_6$ gas is performed simultaneously with the step of supplying the TEA gas.

At the step of supplying the $C_3H_6$ gas, the $C_3H_6$ gas is allowed to flow from the gas supply pipe 232c. The opening/closing control of the APC valve 244 and the valves 243c, 243d and 243e is executed in the same manner as the opening/closing control of the APC valve 244 and the valves 243b, 243d and 243e executed at step 2 of the film forming sequence illustrated in FIG. 4. A supply flow rate of the $C_3H_6$ gas controlled by the MFC 241c is set to fall within a range of, e.g., 100 to 10,000 sccm. An internal pressure of the process chamber 201 is set to fall within a range of, e.g., 1 to 5,000 Pa, specifically, 1 to 4,000 Pa. A partial pressure of the $C_3H_6$ gas within the process chamber 201 is set to fall within a range of, e.g., 0.01 to 4,950 Pa. The time during which the $C_3H_6$ gas is supplied to the wafer 200, namely the gas supply time (irradiation time), is set to fall within a range of, e.g., 1 to 200 seconds, specifically, 1 to 120 seconds, or more specifically, 1 to 60 seconds. Other processing conditions may be the same as, e.g., the processing conditions of step 2 of the film forming sequence illustrated in FIG. 4. As the carbon-containing gas, in addition to the $C_3H_6$ gas, it may be possible to use e.g., a hydrocarbon-based gas such as an acetylene ($C_2H_2$) gas, an ethylene ($C_2H_4$) gas or the like.

According to this modification, the same effects as those of the film forming sequence illustrated in FIG. 4 and those of the respective modifications described above may be achieved. In addition, according to this modification, the C component contained in the $C_3H_6$ gas can be added to the finally-formed film. This makes it possible to enhance the controllability of the control of the composition ratio of the finally-formed film, thereby increasing the C concentration within the finally-formed film. However, it may be advantageous to supply the $C_3H_6$ gas simultaneously with the $NH_3$ gas, the $O_2$ gas, the TEA gas, the $BCl_3$ gas or the TMB gas than to supply the $C_3H_6$ gas simultaneously with the BTCSM gas. By doing so, it is possible to avoid an excessive gas phase reaction within the process chamber 201 and to prevent particles within the process chamber 201 from being generated. Furthermore, it is more desirable to supply the $C_3H_6$ gas simultaneously with the TMB gas or the TEA gas than to supply the $C_3H_6$ gas simultaneously with the $NH_3$ gas, the $O_2$ gas or the $BCl_2$ gas. By doing so, it is possible to enhance the controllability of the control of the composition ratio of the finally-formed film.

Other Embodiments of the Present Disclosure

While one embodiment of the present disclosure has been described above, the present disclosure is not limited to the aforementioned embodiment but may be differently modified without departing from the spirit of the present disclosure.

For example, in the aforementioned embodiment, there has been described an example where the APC valve 244 is used as an exhaust flow path opening/closing unit. However, the present disclosure is not limited thereto. As an example, instead of the APC valve 244 or in addition to the APC valve 244, an opening/closing valve may be installed in the exhaust pipe 231. This opening/closing valve may be used as the exhaust flow path opening/closing unit.

As another example, in the aforementioned embodiment, when closing the exhaust system, the APC valve 244 may not be fully closed but may be slightly opened. For example, when confining the precursor gas within the process chamber 201, a flow of the precursor gas moving from the interior of the process chamber 201 toward the exhaust pipe 231 may be slightly formed by slightly opening the APC valve 244. Thus, a gaseous substance including Cl, which is formed after the precursor gas is decomposed within the process chamber 201, can be removed from the interior of the process chamber 201. This makes it possible to improve the quality of a film forming process.

Figure 15:
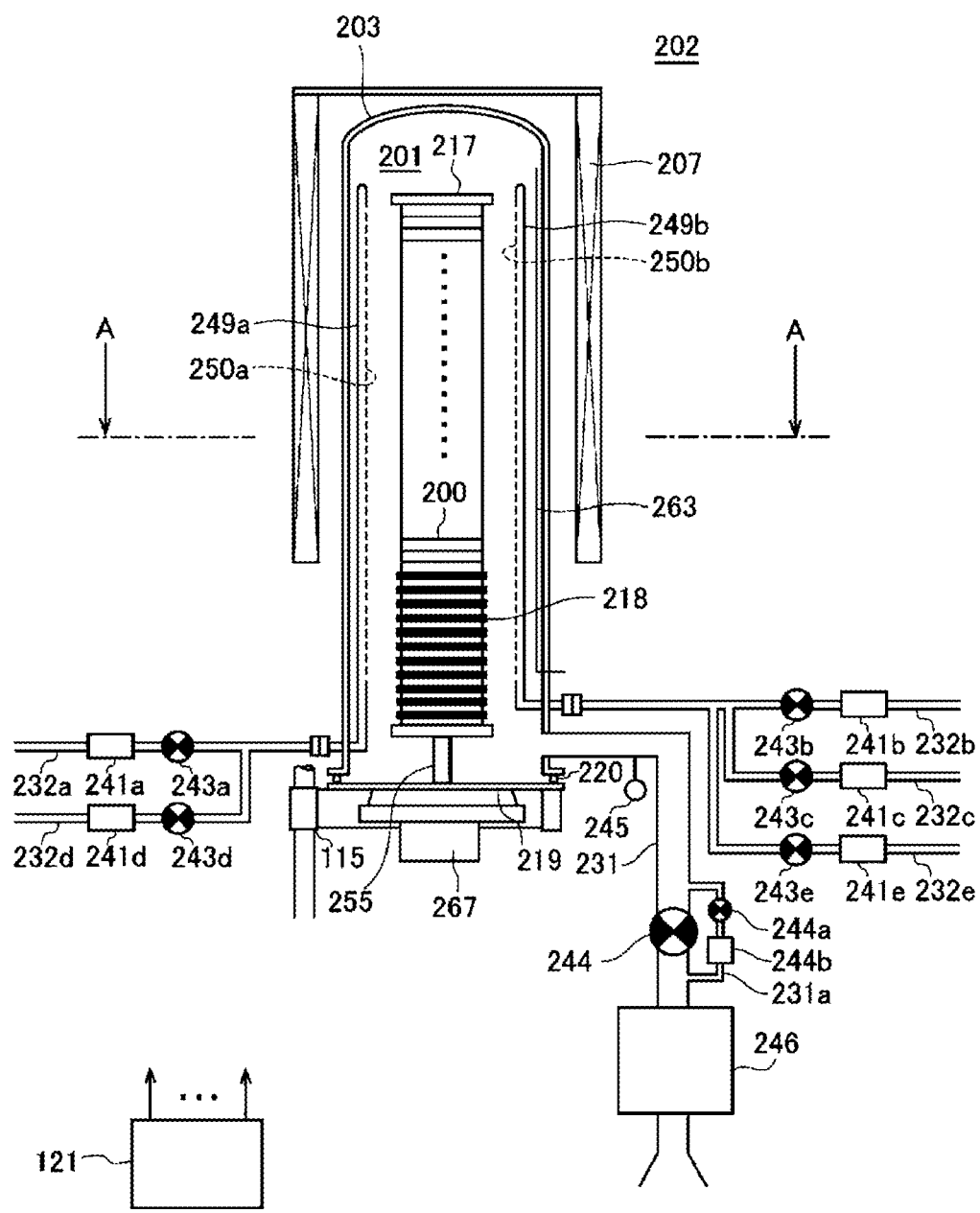
FIG. 15 is a schematic configuration view of a vertical processing furnace of a substrate processing apparatus suitably used in a still further embodiment of the present disclosure, in which a portion of the processing furnace is shown in a vertical cross section.

As a further example, as illustrated in FIG. 15, a bypass exhaust pipe (a slow exhaust pipe) 231a serving as a sub exhaust pipe which bypasses the APC valve 244 may be installed in the exhaust pipe 231. The inner diameter of the bypass exhaust pipe 231a may be set smaller than the inner diameter of the exhaust pipe 231. A valve 244a and an orifice 244b as a throttle portion which serves as a conductance adjusting unit are installed in the bypass exhaust pipe 231a. With this configuration, the conductance within the bypass exhaust pipe 231a can be made sufficiently smaller than the conductance within the exhaust pipe 231. By opening the valve 244a and the bypass exhaust pipe 231a when closing the exhaust system, even if the APC valve 244 is fully closed, it is possible to obtain the same effects as those obtained when slightly opening the APC valve 244. It is also possible to simplify the control of the opening degree of the APC valve 244 when closing the exhaust flow path of the exhaust system. A bypass exhaust system (or a slow exhaust system) configured by the bypass exhaust pipe 231a, the valve 244a and the orifice 244b may be included in the aforementioned exhaust system. Moreover, a bypass exhaust flow path (or a slow exhaust flow path) configured by the bypass exhaust pipe 231a and the orifice 244b may be included in the aforementioned exhaust flow path. In addition, a needle valve or the like provided with an opening degree adjusting mechanism may be used in place of the orifice 244b whose opening degree is fixed.

In the case where the APC valve 244 is slightly opened at the step of confining the precursor gas such as the BTCSM gas or the like, or in the case where the bypass exhaust pipe 231a is installed in the exhaust pipe 231, the precursor gas may be continuously supplied into the process chamber 201 as in modification 1. In this case, it becomes possible to supplement the precursor gas consumed by pyrolysis, namely to maintain the partial pressure of the precursor gas within the process chamber 201. This makes it possible to prevent the formation rate of the first solid layer from being generated, namely reduction of the deposition rate of the finally-formed film.

Not only at the step of supplying the precursor gas but also at the step of supplying the reaction gas, the reaction gas may be supplied to the wafer 200 disposed within the process chamber 201 while keeping the exhaust system closed and may be confined within the process chamber 201. When confining the reaction gas within the process chamber 201, the exhaust flow path of the exhaust system may be sealed. Furthermore, at this time, the internal pressure of the process chamber 201 may be continuously increased by continuously supplying the reaction gas into the process chamber 201. In this case, it is possible to promote activation of the reaction gas supplied into the process chamber 201. Eventually, it becomes possible to increase the formation rate of the second solid layer on the wafer 200, namely the deposition rate of the finally-formed film. Moreover, at this time, the reaction gas may be allowed to freely flow through the process chamber 201 while keeping the exhaust system opened. Thereafter, the reaction gas may be supplied into and confined within the process chamber 201 while keeping the exhaust system closed. In this case, it is possible to urge the removal from the interior of the process chamber 201 of the reaction byproducts or particles generated by the reaction of the precursor gas, which remains within the process chamber 201, with the reaction gas. As a result, it is possible to improve the quality of the finally-formed film.

In the aforementioned embodiment, there has been described an example where the reaction gas is supplied after the supply of the precursor gas. The present disclosure is not limited thereto. The supply order of the precursor gas and the reaction gas may be reversed. That is to say, the precursor gas may be supplied after the supply of the reaction gas. By changing the supply order of the precursor gas and the reaction gas, it is possible to change the quality or the composition ratio of the thin film thus formed. In case where plural kinds of reaction gases are used, the supply order of the reaction gases may be arbitrarily changed. By changing the supply order of the reaction gases, it is possible to change the quality or the composition ratio of the thin film thus formed.

If the silicon-based insulating film formed by the methods of the embodiment or the modifications described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to the embodiment or the modifications described above, it is possible to form a silicon-based insulating film having an ideal stoichiometric ratio without having to use plasma. Since the silicon-based insulating film can be formed without having to use plasma, it is possible to adapt to a process for forming, e.g., a SADP film of a DPT, in which plasma damage is worried about.

In the aforementioned embodiment, there has been described an example where the silicon-based thin film (the SiCN film, the SiOCN film, the SiOC film or the SiBCN film) containing Si as a semiconductor element, namely the silicon carbide-based thin film, is formed as a film containing a predetermined element. The present disclosure is not limited to the aforementioned form but may be appropriately applied to, e.g., a case where a metal-based thin film containing a metal element, namely a transition metal or a typical metal, such as titanium (Ti), zirconium (Zr), hafnium (Hf), tantalum (Ta), niobium (Nb), aluminum (Al), molybdenum (Mo), tungsten (W) or the like is formed.

That is to say, the present disclosure may be suitably applied to, e.g., a case where a metal-based thin film, namely a metal carbide-based film, such as a TiCN film, a TiOCN film, a TiOC film, a TiBCN film, a ZrCN film, a ZrOCN film, a ZrOC film, a ZrBCN film, a HfCN film, a HfOCN film, a HfOC film, a HfBCN film, a TaCN film, a TaOCN film, a TaOC film, a TaBCN film, a NbCN film, a NbOCN film, a NbOC film, a NbBCN film, an AlCN film, an AlOCN film, an AlOC film, an AlBCN film, a MoCN film, a MoOCN film, a MoOC film, a MoBCN film, a WCN film, a WOCN film, a WOC film, a WBCN film, a WBN film or the like is formed. In this case, instead of the precursor gas containing Si used in the aforementioned embodiment, a precursor gas containing a metal element may be used as the precursor gas, whereby film formation can be performed by the same sequence as that of the embodiment or the modifications described above.

In case of forming a Ti-based thin film, a precursor gas containing Ti, C and a halogen element and having a Ti—C bond may be used as a precursor gas containing Ti. As the reaction gas, it may be possible to use the same gas as used in the aforementioned embodiment. The processing conditions used at this time may be the same as, e.g., the processing conditions of the aforementioned embodiment.

In case of forming a Zr-based thin film, a precursor gas containing Zr, C and a halogen element and having a Zr—C bond may be used as a precursor gas containing Zr. As the reaction gas, it may be possible to use the same gas as used in the aforementioned embodiment. The processing conditions used at this time may be the same as, e.g., the processing conditions of the aforementioned embodiment.

In case of forming an Hf-based thin film, a precursor gas containing Hf, C and a halogen element and having an Hf—C bond may be used as a precursor gas containing Hf. As the reaction gas, it may be possible to use the same gas as used in the aforementioned embodiment. The processing conditions used at this time may be the same as, e.g., the processing conditions of the aforementioned embodiment.

In case of forming a Ta-based thin film, a precursor gas containing Ta, C and a halogen element and having a Ta—C bond may be used as a precursor gas containing Ta. As the reaction gas, it may be possible to use the same gas as used in the aforementioned embodiment. The processing conditions used at this time may be the same as, e.g., the processing conditions of the aforementioned embodiment.

In case of forming an Nb-based thin film, a precursor gas containing Nb, C and a halogen element and having an Nb—C bond may be used as a precursor gas containing Nb. As the reaction gas, it may be possible to use the same gas as used in the aforementioned embodiment. The processing conditions used at this time may be the same as, e.g., the processing conditions of the aforementioned embodiment.

In case of forming an Al-based thin film, a precursor gas containing Al, C and a halogen element and having a Al—C bond may be used as a precursor gas containing Al. As the reaction gas, it may be possible to use the same gas as used in the aforementioned embodiment. The processing conditions used at this time may be the same as, e.g., the processing conditions of the aforementioned embodiment.

In case of forming a Mo-based thin film, a precursor gas containing Mo, C and a halogen element and having a Mo—C bond may be used as a precursor gas containing Mo. As the reaction gas, it may be possible to use the same gas as used in the aforementioned embodiment. The processing conditions used at this time may be the same as, e.g., the processing conditions of the aforementioned embodiment.

In case of forming a W-based thin film, a precursor gas containing W, C and a halogen element and having a W—C bond may be used as a precursor gas containing W. As the reaction gas, it may be possible to use the same gas as used in the aforementioned embodiment. The processing conditions used at this time may be the same as, e.g., the processing conditions of the aforementioned embodiment.

That is to say, the present disclosure may be suitably applied to a case where a thin film containing a predetermined element such as a semiconductor element, a metal element or the like as a first element and containing a nonmetallic element such as N, O, B or the like as a second element (or a third element) is formed.

Process recipes (e.g., programs describing processing procedures and processing conditions) used in forming these various kinds of films may be prepared individually (in a plural number) according to the contents of substrate processing (e.g., the kind, composition ratio, quality and thickness of the film to be formed). In addition, at the start of the substrate processing, an appropriate process recipe may be properly selected from the process recipes according to the substrate processing contents. Specifically, the process recipes individually prepared according to the substrate processing contents may be stored (or installed) in advance in the memory device $121c$ of the substrate processing apparatus via a telecommunication line or a recording medium (e.g., the external memory device $123$) storing the process recipes. Moreover, at the start of the substrate processing, the CPU $121a$ of the substrate processing apparatus may properly select an appropriate process recipe from the process recipes stored in the memory device $121c$ according to the substrate processing contents. This configuration enables a single substrate processing apparatus to form films of different kinds, composition ratios, qualities and thicknesses for general purposes and with enhanced reproducibility. In addition, this configuration makes it possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing process recipes already installed in the substrate processing apparatus. In case of modifying the process recipes, the modified process recipes may be installed in the substrate processing apparatus via a telecommunication line or a recording medium storing the process recipes. In addition, the existing process recipes already installed in the substrate processing apparatus may be directly modified by operating the input/output device $122$ of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing conditions may be the same as, e.g., those of the aforementioned embodiment.

Figure 13:
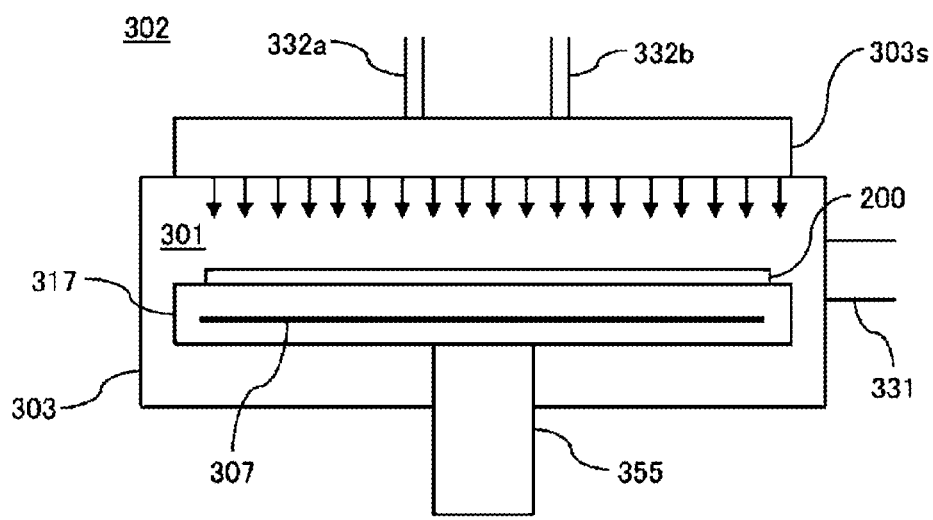
FIG. 13 is a schematic configuration view of a vertical processing furnace of a substrate processing apparatus suitably used in another embodiment of the present disclosure, in which a portion of the processing furnace is shown in a vertical cross section.

The present disclosure may be appropriately applied to a case where a film is formed using a substrate processing apparatus provided with a processing furnace $302$ illustrated in FIG. 13. The processing furnace $302$ includes a process vessel $303$ which defines a process chamber $301$, a shower head 303s configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor gas and a gas supply port 332b configured to the supply the aforementioned reaction gas are connected to inlets (gas introduction holes) of the shower head 303s. A precursor gas supply system identical with the precursor gas supply system of the aforementioned embodiment is connected to the gas supply port 332a. A reaction gas supply system identical with the reaction gas supply system of the aforementioned embodiment is connected to the gas supply port 332b. A gas distribution plate configured to supply a gas into the process chamber 301 in a shower-like manner is installed in outlets (gas discharge holes) of the shower head 303s. An exhaust port 331 configured to evacuate the interior of the process chamber 301 is installed in the process vessel 303. An exhaust system identical with the exhaust system of the aforementioned embodiment is connected to the exhaust port 331.

Figure 14:
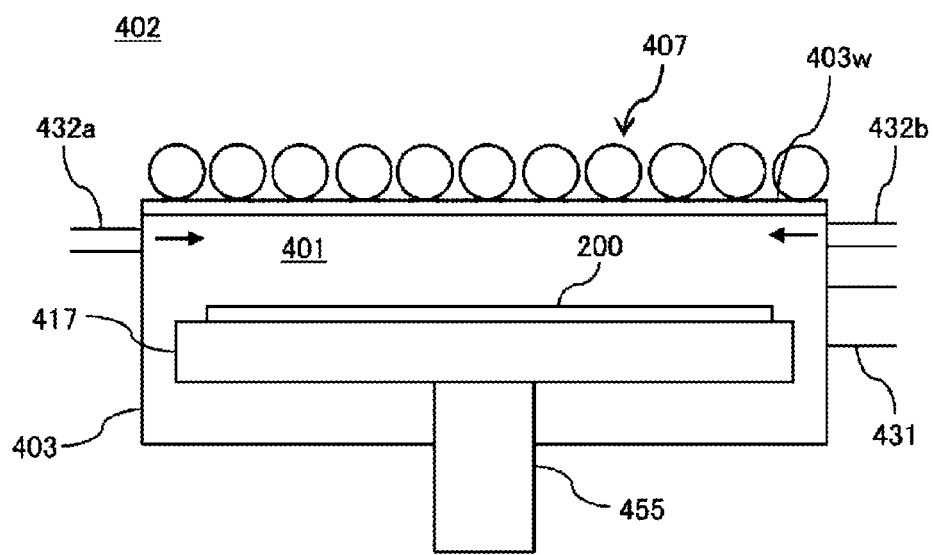
FIG. 14 is a schematic configuration view of a vertical processing furnace of a substrate processing apparatus suitably used in a further embodiment of the present disclosure, in which a portion of the processing furnace is shown in a vertical cross section.

As another example, the present disclosure may be appropriately applied to a case where a film is formed using a substrate processing apparatus provided with a processing furnace 402 illustrated in FIG. 14. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a configured to supply the aforementioned precursor gas and a gas supply port 432b configured to supply the supply the aforementioned reaction gas are connected to the process vessel 403. A precursor gas supply system identical with the precursor gas supply system of the aforementioned embodiment is connected to the gas supply port 432a. A reaction gas supply system identical with the reaction gas supply system of the aforementioned embodiment is connected to the gas supply port 432b. An exhaust port 431 configured to evacuate the interior of the process chamber 401 is installed in the process vessel 403. An exhaust system identical with the exhaust system of the aforementioned embodiment is connected to the exhaust port 431.

In case of using these substrate processing apparatuses, film formation can be performed by the same sequences and processing conditions as those of the embodiments and modifications described above.

The embodiments and modifications described above may be appropriately combined with one another. In addition, the processing conditions used at this time may be the same as, e.g., the processing conditions of the embodiments described above.

Aspects of the Present Disclosure

Hereinafter, some aspects of the present disclosure are additionally described as supplementary notes.
(Supplementary Note 1)
According to one aspect of the present disclosure, there are provided a method of manufacturing a semiconductor device and a substrate processing method, including forming a film containing a first element, a second element, and carbon on a substrate by performing a cycle a predetermined number of times, wherein the cycle includes non-simultaneously performing: forming a first solid layer containing the first element and carbon, and having a thickness of more than one atomic layer and equal to or less than several atomic layers, by supplying a precursor gas having a chemical bond of the first element and carbon to the substrate in a process chamber and confining the precursor gas within the process chamber, under a condition in which the precursor gas is autolyzed and at least a part of the chemical bond of the first element and carbon included in the precursor gas is maintained without being broken; exhausting the precursor gas in the process chamber through an exhaust system; forming a second solid layer by supplying a first reaction gas containing the second element to the substrate in the process chamber to modify the first solid layer; and exhausting the first reaction gas in the process chamber through the exhaust system.
(Supplementary Note 2)
In the method of Supplementary Note 1, in the act of forming the first solid layer, the exhaust system may be closed.
(Supplementary Note 3)
In the method of Supplementary Note 1 or 2, in the act of forming the first solid layer, the exhaust system (an exhaust flow path of the exhaust system) may be sealed.
(Supplementary Note 4)
In the method of any one of Supplementary Notes 1 to 3, in the act of forming the first solid layer, an exhaust flow path of the exhaust system may be fully closed.
(Supplementary Note 5)
In the method of any one of Supplementary Notes 1 to 4, in the act of forming the first solid layer, an exhaust flow path opening/closing unit (exhaust valve) installed in the exhaust system may be fully closed.
(Supplementary Note 6)
In the method of any one of Supplementary Notes 1 to 5, in the act of forming the first solid layer, at least a part of the chemical bond of the first element and carbon included in the precursor gas may be introduced into the first solid layer while the at least a part of the chemical bond of the first element and carbon is maintained without being broken.
(Supplementary Note 7)
In the method of any one of Supplementary Notes 1 to 6, the first solid layer may be a deposition layer in which the first element and carbon are deposited.
(Supplementary Note 8)
In the method of any one of Supplementary Notes 1 to 7, a thickness of the first solid layer is greater than a thickness of a chemisorption layer which is formed by a chemisorption of the precursor gas being saturated (chemisorption of the precursor gas being self-limited).
(Supplementary Note 9)
In the method of any one of Supplementary Notes 1 to 8, the act of forming the first solid layer may be performed under a condition in which a CVD reaction occurs.
(Supplementary Note 10)
In the method of any one of Supplementary Notes 1 to 9, the act of forming the first solid layer may be performed under a condition in which a gas phase reaction occurs.
(Supplementary Note 11)
In the method of any one of Supplementary Notes 1 to 10, in the act of forming the second solid layer, the first reaction gas may be supplied to the substrate in the process chamber, under a condition in which at least a part of the chemical bond of the first element and carbon included in the first solid layer is maintained without being broken.

(Supplementary Note 12)

In the method of any one of Supplementary Notes 1 to 11, the cycle may further include performing: supplying a second reaction gas containing a third element to the substrate in the process chamber; and exhausting the second reaction gas in the process chamber through the exhaust system, wherein the cycle is performed a predetermined number of times to form a film containing the first element, the second element, the third element and carbon on the substrate.

(Supplementary Note 13)

In the method of any one of Supplementary Notes 1 to 12, the cycle may further include non-simultaneously performing: forming a third solid layer by supplying a second reaction gas containing a third element to the substrate in the process chamber to modify the second solid layer; and exhausting the second reaction gas in the process chamber through the exhaust system, wherein the cycle is performed a predetermined number of times to form a film containing the first element, the second element, the third element and carbon.

(Supplementary Note 14)

In the method of any one of Supplementary Notes 1 to 13, the precursor gas may contain the first element, carbon, and a halogen element.

(Supplementary Note 15)

In the method of any one of Supplementary Notes 1 to 13, the precursor gas may have at least two chemical bonds of the first element and carbon in one molecule of the precursor gas (in a chemical structural formula thereof).

(Supplementary Note 16)

In the method of any one of Supplementary Notes 1 to 15, the first reaction gas may include at least one selected from a group consisting of a nitrogen-containing gas (a nitriding gas or a hydrogen nitride-based gas), a carbon-containing gas (a hydrocarbon-based gas), a nitrogen- and carbon-containing gas (an amine-based gas or an organic hydrazine-based gas), an oxygen-containing gas (an oxidizing gas), a boron-containing gas (a borane-based gas), and a boron-, nitrogen- and carbon-containing gas (a borazine-based gas).

(Supplementary Note 17)

In the method of any one of Supplementary Notes 1 to 16, the cycle may be performed a predetermined number of times under a non-plasma condition.

(Supplementary Note 18)

According to another aspect of the present disclosure, there is provided a substrate processing apparatus, including a process chamber configured to accommodate a substrate; a precursor gas supply system configured to supply a precursor gas having a chemical bond of a first element and carbon to the substrate in the process chamber; a reaction gas supply system configured to supply a reaction gas containing a second element to the substrate in the process chamber; a heater configured to heat the substrate in the process chamber; an exhaust system configured to evacuate an interior of the process chamber; and a control unit configured to control the precursor gas supply system, the reaction gas supply system, the heater, and the exhaust system so as to perform a process of forming a film containing the first element, the second element, and carbon on the substrate by performing a cycle a predetermined number of times, wherein the cycle includes non-simultaneously performing: forming a first solid layer containing the first element and carbon, and having a thickness of more than one atomic layer and equal to or less than several atomic layers, by supplying the precursor gas to the substrate in the process chamber and confining the precursor gas within the process chamber, under a condition in which the precursor gas is autolyzed and at least a part of the chemical bond of the first element and carbon included in the precursor gas is maintained without being broken; exhausting the precursor gas in the process chamber through the exhaust system; forming a second solid layer by supplying the reaction gas to the substrate in the process chamber to modify the first solid layer; and exhausting the reaction gas in the process chamber through the exhaust system.

(Supplementary Note 19)

According to a further aspect of the present disclosure, there are provided a program and a non-transitory computer-readable recording medium storing the program, wherein the program is configured to cause a computer to perform a process of forming a film containing a first element, a second element, and carbon on a substrate by performing a cycle a predetermined number of times, wherein the cycle includes non-simultaneously performing: forming a first solid layer containing the first element and carbon, and having a thickness of more than one atomic layer and equal to or less than several atomic layers, by supplying a precursor gas having a chemical bond of the first element and carbon to the substrate in a process chamber and confining the precursor gas within the process chamber, under a condition in which the precursor gas is autolyzed and at least a part of the chemical bond of the first element and carbon included in the precursor gas is maintained without being broken; exhausting the precursor gas in the process chamber through an exhaust system; forming a second solid layer by supplying a reaction gas containing the second element to the substrate in the process chamber to modify the first solid layer; and exhausting the reaction gas in the process chamber through the exhaust system.

According to the present disclosure, it is possible to form a film having a high carbon concentration.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film containing a first element, a second element, and carbon on a substrate by performing a cycle a predetermined number of times, wherein the cycle includes non-simultaneously performing:

forming a first solid layer containing the first element and carbon, and having a thickness of more than one atomic layer and equal to or less than several atomic layers, by supplying a precursor gas having a chemical bond of the first element and carbon, to the substrate in a process chamber and confining the precursor gas within the process chamber, under a condition in which the precursor gas is autolyzed and at least a part of the chemical bond of the first element and carbon included in the precursor gas is maintained without being broken;

exhausting the precursor gas in the process chamber through an exhaust system;

forming a second solid layer containing the first element, the carbon and the second element by supplying a first reaction gas containing the second element to the substrate in the process chamber and confining the first reaction gas within the process chamber to modify the first solid layer; and exhausting the first reaction gas in the process chamber through the exhaust system, wherein in the act of forming the second solid layer, the exhaust system is sealed.

2. The method of claim 1, wherein in the act of forming the first solid layer, the exhaust system is closed.

3. The method of claim 1, wherein in the act of forming the first solid layer, the exhaust system is sealed.

4. The method of claim 1, wherein in the act of forming the first solid layer, an exhaust flow path of the exhaust system is fully closed.

5. The method of claim 1, wherein in the act of forming the first solid layer, an exhaust flow path opening/closing unit installed in the exhaust system is fully closed.

6. The method of claim 1, wherein in the act of forming the first solid layer, at least a part of the chemical bond of the first element and carbon included in the precursor gas is introduced into the first solid layer while the at least a part of the chemical bond of the first element and carbon is maintained without being broken.

7. The method of claim 1, wherein the first solid layer is a deposition layer in which the first element and carbon are deposited.

8. The method of claim 1, wherein a thickness of the first solid layer is greater than a thickness of a chemisorption layer which is formed by a chemisorption of the precursor gas being saturated.

9. The method of claim 1, wherein the act of forming the first solid layer is performed under a condition in which a CVD reaction occurs.

10. The method of claim 1, wherein the act of forming the first solid layer is performed under a condition in which a gas phase reaction occurs.

11. The method of claim 1, wherein, in the act of forming the second solid layer, the first reaction gas is supplied to the substrate in the process chamber, under a condition in which at least a part of the chemical bond of the first element and carbon included in the first solid layer is maintained without being broken.

12. The method of claim 1, wherein the cycle further includes performing:

supplying a second reaction gas containing a third element to the substrate in the process chamber; and exhausting the second reaction gas in the process chamber through the exhaust system, wherein the cycle is performed a predetermined number of times to form a film containing the first element, the second element, the third element and carbon on the substrate.

13. The method of claim 1, wherein the cycle further includes non-simultaneously performing:

forming a third solid layer by supplying a second reaction gas containing a third element to the substrate in the process chamber to modify the second solid layer; and exhausting the second reaction gas in the process chamber through the exhaust system, wherein the cycle is performed a predetermined number of times to form a film containing the first element, the second element, the third element and carbon.

14. The method of claim 1, wherein the precursor gas contains the first element, carbon, and a halogen element.

15. The method of claim 1, wherein the precursor gas has at least two chemical bonds of the first element and carbon in one molecule of the precursor gas.

16. The method of claim 1, wherein the first reaction gas comprises at least one selected from a group consisting of a nitrogen-containing gas, a carbon-containing gas, a nitrogen- and carbon-containing gas, an oxygen-containing gas, a boron-containing gas, and a boron-, nitrogen- and carbon-containing gas.

17. The method of claim 1, wherein the cycle is performed a predetermined number of times under a non-plasma condition.

18. A non-transitory computer-readable recording medium storing a program that causes a computer to perform a process of forming a film containing a first element, a second element, and carbon on a substrate by performing a cycle a predetermined number of times, wherein the cycle includes non-simultaneously performing:

forming a first solid layer containing the first element and carbon, and having a thickness of more than one atomic layer and equal to or less than several atomic layers, by supplying a precursor gas having a chemical bond of the first element and carbon to the substrate in a process chamber and confining the precursor gas within the process chamber, under a condition in which the precursor gas is autolyzed and at least a part of the chemical bond of the first element and carbon included in the precursor gas is maintained without being broken;

exhausting the precursor gas in the process chamber through an exhaust system;

forming a second solid layer by supplying a reaction gas containing the second element and confining the first reaction gas within the process chamber to the substrate in the process chamber to modify the first solid layer; and exhausting the reaction gas in the process chamber through the exhaust system, wherein in the act of forming the second solid layer, the exhaust system is sealed.

19. The method of claim 1, wherein the first reaction gas includes carbon.

* * * * *